(12) United States Patent
Haase et al.

(10) Patent No.: US 6,400,151 B1
(45) Date of Patent: Jun. 4, 2002

(54) METHOD AND APPARATUS FOR THE ACQUISITION OF DATA FOR MAGNETIC RESONANCE IMAGING

(76) Inventors: Axel Haase, Weinbergstr. 50, 97222 Rimpar; Peter M. Jakob, Unterer Neubergweg 6 b, 97074 Würzburg; Claudia Hillenbrand, Bergstrasse 23, 97720 Nüdlingen; Dietbert Hahn, Gartenstr. 12, 97273 Kürnach, all of (DE)

( * ) Notice: Subject to any disclaimer, the term of this patent is extended or adjusted under 35 U.S.C. 154(b) by 0 days.

(21) Appl. No.: 09/482,031

(22) Filed: Jan. 13, 2000

(30) Foreign Application Priority Data

Jan. 14, 1999 (DE) .......................................... 199 01 171

(51) Int. Cl.⁷ ............................................... G01V 3/00
(52) U.S. Cl. ...................................... 324/309; 324/307
(58) Field of Search ................................ 324/309, 307, 324/300, 316, 318

(56) References Cited

U.S. PATENT DOCUMENTS

| 5,168,226 A | | 12/1992 | Hinks .......................... 324/309 |
| 5,522,390 A | | 6/1996 | Tuithof et al. ............ 128/653.2 |
| 5,615,676 A | * | 4/1997 | Kohno ..................... 128/653.2 |
| 5,680,045 A | | 10/1997 | Feinberg ...................... 324/309 |
| 5,754,046 A | | 5/1998 | Busch et al. ................. 324/309 |
| 5,910,728 A | * | 6/1999 | Sodickson ................... 324/309 |

OTHER PUBLICATIONS

P. Mansfield, "Multi–planar image formation using NMR spin echoes", J. Phys. C: Solid State Phys., vol. 10, 1977, L55–L58.

J. Frahm, et. al., "Rapid NMR Imaging Using Stimulated Echoes", Journal of Magnetic Resonance 65, (1985), 130–135.

J. Hennig, et. al., "RARE Imaging: A Fast Imaging Method for Clinical MR", Magnetic Resonance in Medicine 3, (1986), 823–833.

A. Haase, et. al., "Flash Imaging. Rapid NMR Imaging Using Low Flip–Angle Pulses", Journal of Magnetic Resonance 67, (1986), 258–266.

A. Haase, "Snapshot Flash MRI. Applications to T1, T2, and Chemical–Shift Imaging", Magnetic Resonance in Medicine 13, (1990), 77–89.

(List continued on next page.)

Primary Examiner—Jay Patidar
Assistant Examiner—Borij B. Shrivastav
(74) Attorney, Agent, or Firm—Dennison, Scheiner & Schultz

(57) ABSTRACT

In order to acquire data for an image representation which shows the spatial distribution of the magnetic resonance behavior of an object within a selected localized region, the relevant localized region is arranged in a stationary magnetic field and is subjected to a sequence of high frequency pulses and pulses of magnetic field gradients in different spatial directions, such that a succession of magnetic resonance signals appears. These signals are read out by scanning under the influence of a read gradient and are used as sets of data for the filling of the K-space. In accordance with the invention, at least two different sequences of high frequency pulses and magnetic field gradient pulses are used, which differ in at least one of the features of the signal creation responsible for different aspects of the image quality. These sequences are executed one after another in time, with the magnetic resonance signals read out for the different sequences being collated in different bands of the K-space.

18 Claims, 20 Drawing Sheets

OTHER PUBLICATIONS

Koichi Oshio, et. al., "GRASE (Gradient–and Spin–Echo) Imaging: A Novel Fast MRI Technique", Magnetic Resonance in Medicine 20, (1991), 344–349.

Koichi Oshio, et. al., "Single–Shot GRASE Imaging without Fast Gradients", Magnetic Resonance in Medicine 26, (1992), 355–360.

David A. Feinberg, et. al., "GRASE Improves Spatial Resolution in Single Shot Imaging", Magnetic Resonance in Medicine 33, (1995), 529–533.

J. Hennig, et. al., "Burst imaging", MAGMA 1 (1993), 39–48.

I. J. Lowe, et. al., "DANTE Ultrafast Imaging Sequence (DUFIS)", Journal of Magnetic Resonance, Series B 101, (1993), 106–109.

Paul Margosian, et. al., "Faster MR Imaging: Imaging with Half the Data", Health Care Instrumentation, (1986)195–197.

David A. Feinberg, et. al., Halving MR Imaging Time by Conjugation: Demonstration at 3.5 KG, Radiology vol. 161, No. 2 (1986), 527–531.

G. C. McKinnon, "Ultrafast Interleaved Gradient–Echo–Planar Imaging on a Standard Scanner", Magnetic Resonance in Medicine 30 (1993), 609–616.

Shujun Ding, et al., "A Hybrid Fast Imaging Method of RARE and Burst/Quest", in Proc. SMR 2nd Annual Meeting, San Francisco, 1994, p. 487.

Peter van Geldersen, et. al., "Susceptibility Insensitive Single Shot MRI Combining BURST and Multiple Spin Echoes", Magnetic Resonance in Medicine 33 (1995), 439–442.

Daniel K. Sodickson, et. al., "Simultaneous Acquisition of Spatial Harmonics (SMASH): Fast Imaging with Radiofrequency Coil Arrays", Magnetic Resonance in Medicine 38 (1997), 591–603.

Klaas P. Pruessman, et. al., "Coil Sensitivity Encoding for Fast MRI", ISMRM 6th Annual Meeting, (1998), p. 579.

Michael Hutchinson, et. al., "Fast MRI Data Acquisition Using Multiple Detectors", Magnetic Resonance in Medicine 6 (1998), 87–91.

J. W. Carlson, et. al., "Imaging Time Reduction through Multiple Receiver Coil Data Acquisition and Image Reconstruction", Magnetic Resonance in Medicine 29 (1993), 681–687.

J. B. Ra, et al., "Fast Imaging Using Subencoding Data Sets from Multiple Detectors", Magnetic Resonance in Medicine 30, (1993), 142–145.

Anna E. Holsinger, et. al., "The Importance of Phase Encoding Order in Ultra–Short TR Snapshot MR Imaging", Magnetic Resonance in Medicine 16 (1990), 481–488.

R. V. Mulkern, et. al., "Contrast Manipulation and Artifact Assessment of 2D and 3D Rare Sequences", Magnetic Resonance Imaging, vol. 8, (1990), 557–566.

D. R. Bailes, et al., "Respiratory Ordered Phase Encoding (Rope): A Method for Reducing Respiratory Motion Artefacts in M Imaging", Journal of Computer Assisted Tomography 9(4) Jul./Aug. (1985), 835–838.

E. Mark Haacke, et. al. "Reducing Motion Artifacts in Two–Dimensional Fourier Transform Imaging", Magnetic Resonance Imaging, vol. 4, (1986), 359–379.

Hope W. Korin, et. al., "Altered Phase–Encoding Order for Reduced Sensitivity to Motion in Three–Dimensional MR Imaging", SMRI 2, (1992), 687–693.

Christopher K. Macgowan, et. al., "Phase–Encode Reordering to Minimize Errors Caused by Motion", Magnetic Resonance Imaging 35 (1996), 391–398.

Markus Weiger, et. al. "Motion–Adapted Gating Based on k–Space Weighting for Reduction of Respiratory Motion Artifacts", Magnetic Resonance Imaging 38 (1997), 322–333.

Miha Fuderer, "The Information Content of MR Images", IEEE Transactions on Medical Imaging, vol. 7, No. 4, Dec. 1988, 368–380.

Joop J. van Vaals, et. al., "'Keyhole' Method for Accelerating Imaging of Contrast Agent Uptake", SMRI (1993) 671–675.

David A. Feinberg, et. al., "Phase Errors in Multi–Shot Echo Planar Imaging", Magnetic Resonance Imaging 32 (1994) 535–539.

Franciszek Hennel, "Multiple–Shot Echo–Planar Imaging", Concepts in Magnetic Resonance, vol. 9(1) (1997), 43–58.

B. Chapman, et. al. "Real–Time Movie Imaging from a Single Cardiac Cycle by NMR", Magnetic Resonance in Medicine 5, (1987) 246–254.

Robert R. Edelman, et. al., "Coronary Arteries: Breath–hold MR Angiography", Cardiac Radiology 181, (1991), 641–643.

Dennis J. Atkinson, et. al., "Cineangiography of the Heart in a Single Breath Hold with a Segmented TurboFlash Sequence", Cardiac Radiology 178, (1991), 357–360.

Peter M. Jakob, et. al., "Half–Fourier Burst Imaging on a Clinical Scanner", Magnetic Resonance in Medicine 38, (1997), 534–540.

John P. Mugler III, "Potential Degradation in Image Quality Due to Selective Averaging of Phase–Encoding Lines in Fourier Transform MRI", Magnetic Resonance in Medicine 19, (1991), 170–174.

Chrit T. W. Moonen, et. al., "A Fast Gradient–Recalled MRI Technique with Increased Sensitivity to Dynamic Susceptibility Effects", Magnetic Resonance in Medicine 26, (1992), 184–189.

David A. Feinberg, et. al., "Gradient–Echo Shifting in Fast MRI Techniques (GRASE Imaging) for Correction of Field Inhomogeneity Errors and Chemical Shift", Journal of Magnetic Resonance 97, (1992), 177–183.

\* cited by examiner

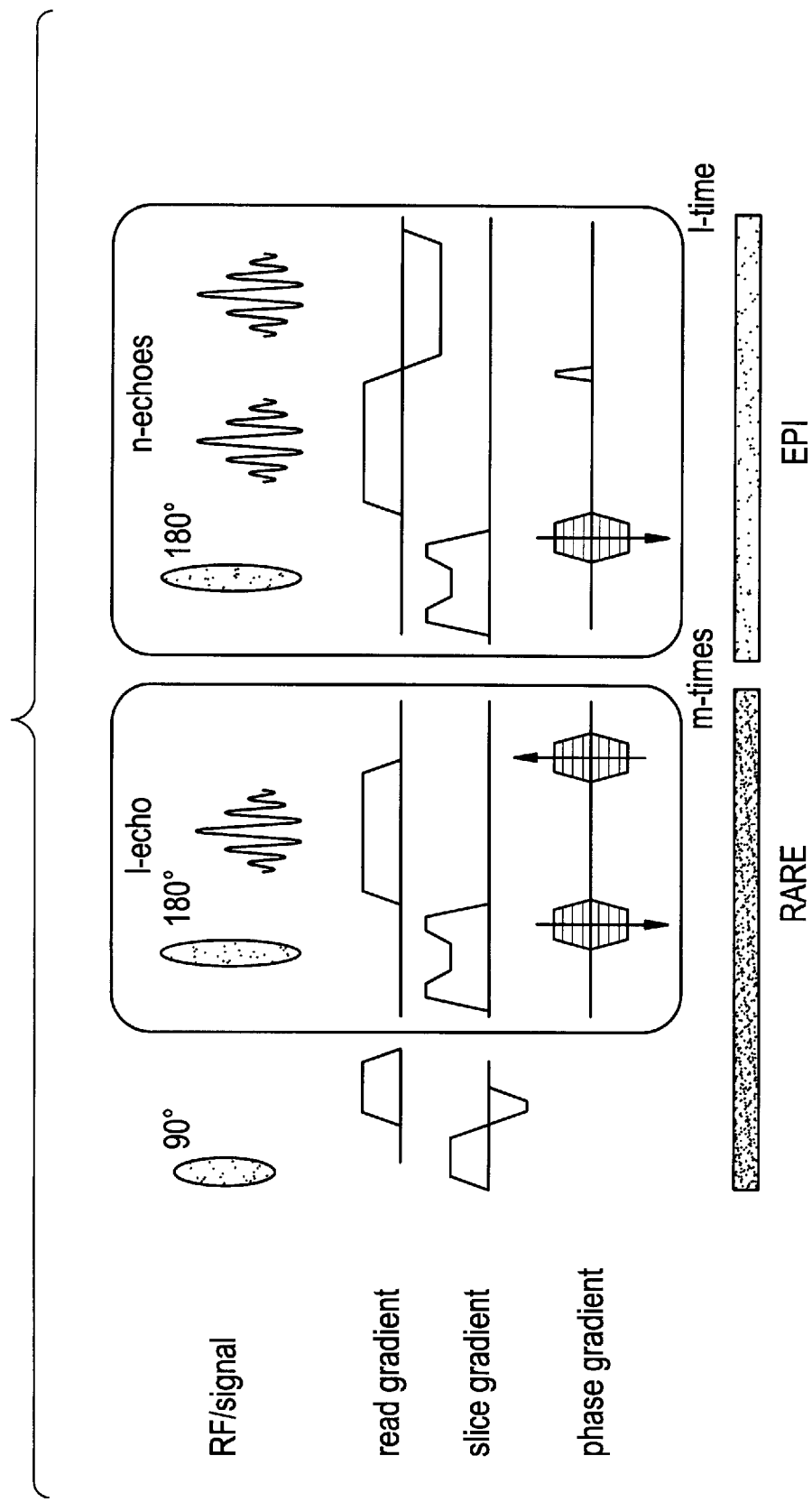

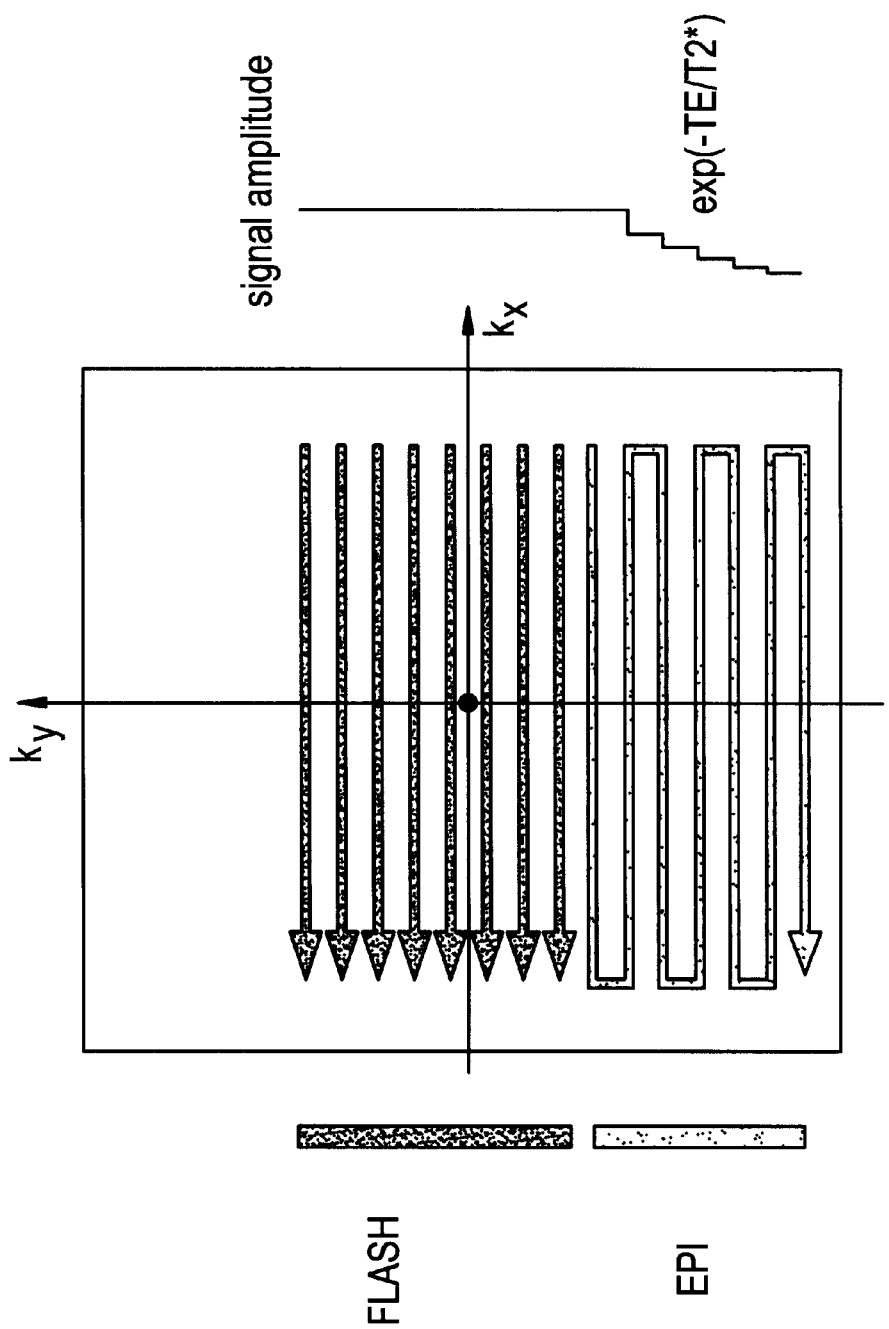

METHOD AND APPARATUS FOR THE ACQUISITION OF DATA FOR MAGNETIC RESONANCE IMAGING

The present invention relates to the locally resolved investigation of objects by means of magnetic resonance (MR) and particularly concerns a method of and an apparatus for the acquisition of data for an image representation which shows the spatial distribution of the MR behavior of an object within a selected localised region, according to the preamble of claim 1 and of claim 18 respectively.

In the conventional MR imaging methods, the object region to be investigated, i.e. the "probe", is arranged in a stationary magnetic field $B_0$ and a succession of at least one electromagnetic high frequency (HF) pulse of selected frequency and following pulses of magnetic field gradients are applied in different spatial directions, such that, as a consequence of the high frequency excitation, echoes appear which are detected as NMR signals and which give information as to the condition of the probe. In this connection, besides the density of the spin which can be influenced by the high frequency pulses, there are various characteristic relaxation time constants of the spin magnetisation, among others the spin-grid relaxation time T1, the spin-spin relaxation time T2 and the effective spin-spin relaxation time T2*. Mention should also be made of the time constant designated as T1, which describes the relaxation of the magnetisation in the direction of an effective magnetic field which is composed of static and a high frequency magnetic field. In other words, T1 describes the relaxation in a rotating coordinate system.

The energy content of the high frequency pulses determines the amount of the excited spin capable of emitting an MR signal (transversal magnetisation) in proportion to the spin present in the equilibrium condition (longitudinal magnetisation). The inverse tangent of this ratio is designated as the flip angle of the high frequency pulse.

The resonance frequency of the spin and consequently the frequency both of an excitable high frequency pulse and also of the measurable MR signals is determined by the localised magnetic field strength. For the localised resolution, therefore for all imaging methods, during the signal detection, a so-called read gradient is imposed in a chosen spatial direction, in order to associate different local regions along this direction with different frequencies in the signal (frequency coding). By a Fourier transformation, the different frequencies and consequently the contributions of different local regions can be separated. In this way, a localised resolution is possible in the relevant spatial direction, which is designated also as the "frequency axis".

In order to achieve localised resolution in a second spatial direction which is orthogonal to the read direction, it is conventional, before the appearance of the signal to be detected, to impose transiently a gradient in this direction, which has the effect of dephasing the oscillations (spins) excited in the probe along the relevant spatial direction. By stepped changing of the time integral of this "phase gradient" from echo to echo, the phase of the signal contribution originating from one local place changes from echo to echo. The signal contributions of the different places along this direction can be separated from one another by a Fourier transformation with reference to the current number of the echo. Since frequency and phase are separately dependent on the position along orthogonal spatial coordinates, a two-dimensional image of the object can be reconstructed.

A local selection in a third spatial direction is effected by applying a gradient in this direction during the exciting frequency-selective high frequency pulses. By this "slice gradient" a slice is selected in the object for the excitation.

The most common MR imaging methods work with the combined frequency and phase coding described above. For the representation for example of a two-dimensional N-line image, N echoes are produced one after another, each with a different phase coding and with each echo of this N echo sequence being. frequency coded in the same way by the read gradient and scanned as an MR signal. From the scanned values of the detected signals, a two-dimensional matrix of data is formed, the so-called K-space, each row or "line" of which has a different frequency coded echo associated therewith and contains scanned values of the relevant echo. The line direction is also designated as the frequency axis of the K-space. The axis of the K-space which is orthogonal to this is scaled as phase coordinates, i.e. the position of a row along this axis is defined by the integral of the phase gradients. The data matrix which is thus organised is then subjected to a two-dimensional Fourier transformation (2D-FT) in order to obtain the pixel values of the image.

Also, other less usual MR imaging methods (projection reconstruction imaging, spiral imaging) can be used to scan the 2D-K-space, where the strict separation between phase coding direction and read gradient direction is abolished in these methods. In general, with these methods, the K-space is scanned not equidistantly in non-rectangular trajectories. Therefore, for these methods, other image reconstruction methods must be used.

In the MR signals one must differentiate between three different types. The so-called "spin echo signal" arises from refocusing of the magnetic field inhomogeneity effects by means of an additional high frequency pulse which is applied for a certain time after the first high frequency excitation pulse. The so-called "gradient echo signal" is produced by polarity reversal of a magnetic field gradient (usually the read gradient), as a result of which there is a refocusing of the de-phasing brought about by the previous effect of this gradient. So-called "stimulated echo signals" and echo signals of higher order arise after a succession of at least three high frequency pulses with flip angles which are not equal to 180°.

The total echo sequence ("N echo sequence") required for the receipt of an N-line image can be produced by the most varied of MR sequences. Each MR sequence is composed of a single sequence or by multiple repetition of the same sequence of high frequency pulses and magnetic field gradient shifts.

The required N echo sequence can be produced by sequences consisting of an N-fold repetition of the same sequence, wherein each sequence consists of a single high frequency excitation pulse and a single echo, so-called 1-echo sequence, developed from a read gradient reversal (gradient echo) or a refocusing high frequency pulse in combination with suitable read gradient shifts (spin echo). Alternatively however, after a high frequency excitation pulse, several spin echoes and/or gradient echoes can be produced within a sequence, and can be coded for the image representation in the manner described above. One would speak here of multi-echo sequences (M-echo sequence). Depending upon whether one produces all required N echoes by means of one excitation and a single sequence, or whether the N echoes are collected in several successive sequences each with its own excitation pulse sequence, one speaks of a single-shot sequence or of multi-shot sequence methods.

In many applications of the MR imaging one is seeking to carry out the echo production and echo detection as rapidly as possible. In the last two decades, a large number of rapid imaging techniques have been proposed which are described extensively in the literature. Some of the methods described there have achieved wide use. From the methods conventional at the present time, the single-shot sequence variation of the so-called "echo planar imaging" (EPI) is the most rapid; here the whole total image information is obtained in a single sequence in the form of gradient echoes after a single excitation pulse by an ultra-fast sequence of read gradient reversals within 25 to 250 ms, so that image artefacts caused by movement are almost completely excluded. However, this method has the disadvantage of poor spatial resolution, since the number of the echoes measurable after the excitation pulse is limited because of the inherent rapid $T2^*$ relaxation. Moreover, this method imposes high demands in terms of hardware on the MR imaging system, particularly in respect of the homogeneity of the static magnetic field, the gradient strength, the gradient switching speed and the gradient amplification power.

For these reasons, in the past, special modified arrangements of the EPI method and other rapid but less critical methods have been proposed, which are described extensively in the literature and several of which have in the meantime proved to be preferable in practice. There follows a representative selection of base materials from the literature;

[1] P. Mansfield, "Multi-planar formation using NMR spin echos", J. Phys. C. Solid State 10, L55–L58 (1977);

[2] J. Frahm, A. Haase, D. Matthaei, K.-D. Merboldt, W. Hänicke, "Rapid NMR imaging using stimulated echos", J. Magn. Reson. 65, 130–135 (1985);

[3] J. Hennig, A. Nauerth, H. Friedburg, "RARE imaging: a fast imaging method for clinical MR", Magn. Reson. Med. 3, 823–833 (1986);

[4] A. Haase, J. Frahm, D. Matthaei, W. Hänicke, K.-D. Merboldt, "FLASH imaging. Rapid NMR imaging using low flip-angle pulses", J. Magn. Reson. 67, 258–266 (1986);

[5] A. Haase, "Snapshot FLASH MRI. Applications to T1, T2, and chemical shift imaging", Magn. Res. Med. 13, 77–89 (1990);

[6] K. Oshio, D. A. Feinberg, "GRASE (Gradient-and-Spin-Echo) Imaging: A novel Fast MRI Technique", Magn. Res. Med. 20, 344–349 (1991);

[7] K. Oshio, D. A. Feinberg, "Single-shot GRASE imaging without fast gradients", Magn. Res. Med. 26, 355–360 (1992);

[8] D. A. Feinberg, B. Kiefer, G. Johnson, "GRASE Improves Spatial Resolution in Single Shot Imaging", Magn. Res. Med. 33, 529–533 (1995);

[9] J. Hennig, M. Hodapp, "Burst imaging", MAGMA 1, 39–48, (1995);

[10] I. J. Lowe, R. E. Wysong, "DANTE ultrafast imaging sequence (DUFIS)", J. Magn. Res., Series B 101, 106–109 (1993);

[11] P. Margosian, F. Schmitt, D. E. Purdy, "Faster MR imaging: Imaging with half the data", Health Care Instr. 1, 195–197 (1986);

[12] D. Feinberg, J. Hale, J. Watts, L. Kaufmann, A. Mark, "Halving MR Imaging Time by Conjugation: Demonstration at 3.5 kG", Radiology 162, 527–531 (1986);

[13] G. C. McKinnon, "Ultrafast interleaved gradient-echoplanar imaging on a standard scanner", Magn. Res. Med. 30, 609–616 (1993);

[14] S. Dang, J. B. Weaver, J. F. Dunn, "A hybrid fast imaging method of RARE and BURST/QUEST", in Proc. SMR 2nd Annual Meeting, San Francisco, 1994, page 487;

[15] P. van Gelderen, C. T. W. Moonen, J. H. Duyn, "Susceptibility Insensitive Single Shot MRI Combining BURST and Multiple Spin Echos", Magn. Res. Med. 33, 439–442 (1995);

[16] D. K. Sodickson, W. J. Manning, "Simultaneous Acquisition of Spatial Harmonics (SMASH): Fast Imaging with Radiofrequency Coil Arrays", Magn. Res. Med. 38, 591–603 (1997);

[17] K. P. Prüssmann, M. Weiger, M. B. Scheidegger, P. Boesiger, "Coil Sensitivity Encoding for Fast MRI", ISMRM 6th Annual Meeting, page 579 (1998);

[18] M. Hutchinson, U. Raff, "Fast MRI data acquisition using multiple detectors", Magn. Res. Med. 6, 87–91 (1988);

[19] J. W. Carlson, T. Minemura, "Imaging time reduction through multiple receiver coil data acquisition and image reconstruction", Magn. Res. Med. 29, 681–688 (1993);

[20] J. B. Ra, C. Y. Rim, "Fast imaging using subencoding data sets from multiple detectors", Magn. Res. Med. 30, 142–145 (1993);

[21] A. E. Holsinger, S. J. Riederer, "The importance of phase encoding order in ultra-short TR snapshot MR imaging", Magn. Res. Med. 16, 481–488 (1990);

[22] R. V. Mulkern, S. T. S. Wong, C. Winalski, F. A. Jolesz, "Contrast manipulation and artifact assessment of 2D and 3D RARE sequences", Magn. Reson. Imag. 8, 557–566 (1990);

[23] D. R. Bailes, D. J. Gilderdale, G. M. Bydder, A. G. Collins, D. N. Fermin, "Respiratory Ordering of Phase Encoding (ROPE): a method for reducing respiratory motion artifacts in MR imaging", J. Comput. Assist. Tomogr. 9(4), 835–838 (1985);

[24] E. M. Haacke, J. L. Patrick, "Reducing motion artifacts in two-dimensional Fourier transform imaging", Magn. Reson. Imaging 4, 359–376 (1986);

[25] H. W. Korin, S. J. Riederer, A. E. H. Bampton, R. L. Ehmann, "Altered Phase–Encoding Order for Reduced Sensitivity to Motion in Three-dimensional MR Imaging", JMRI 2, 687–693 (1992);

[26] C. K. Macgowan, M. L. Wood, "Phase-Encode Reordering to Minimize Errors Caused by Motion", Magn. Res. Med. 35, 391–398 (1996);

[27] M. Weiger, P. Börnert, R. Proska, T. Schäffter, A. Haase, "Motion-Adapted Gating Based on k-space Weighting for Reduction of Respiratory Motion Artifacts", Magn. Res. Med. 38, 322–323 (1997);

[28] M. Fuderer, "The information content of MR images", IEEE Trans. Med. Imaging 7, 368–380 (1988);

[29] J. J. van Vaals, M. E. Brummer, W. T. Dixon, H. H. Tuithof, H. Engels, R. C. Nelson, B. M. Gerety, J. L. Chezmar, J. A. den Boer. "'Keyhole' Method for accelerating Imaging of Contrast Agent uptake", JMRI 3, 671–675 (1993);

[30] D. A. Feinberg, K. Oshio, "Phase Errors in Multi-Shot EPI", Magn. Res. Med. 32, 535–539 (1994);

[31] F. Hennel, "Multiple-Shot Echo-Planar Imaging", Concepts in Magn. Reson. 9(1), 43–58 (1997);

[32] B. Chapmann, R. Turner, R. J. Ordidge, M. Doyle, M. Cawley, R. Coxon, P. Glover, "Real-Time Movie Imaging from a Single Cardiac Cycle by NMR", Magn. Res. Med. 5, 246–254 (1987);

[33] R. R. Edelman, W. J. Manning, D. Burstein, S. Paulin, "Breath-Hold MR angiography of human coronary arteries", Radiology 181, 641–643 (1991);

[34] D. J. Atkinson, R. R. Edelman, "Cineangiography of the heart in a single breath-hold with a segmented turbo-FLASH sequence", Radiology 178, 357–360 (1991);

[35] P. M. Jakob, M. Griswold, K. O. Lövblad, Q. Chen, R. R. Edelmann, "Half-Fourier BURST Imaging on a clinical scanner", Magn. Res. Med. 38 (4), 534–540 (1997);

[36] J. P. Mugler III, "Potential Degradation in Image Quality Due to Selective Averaging of Phase-Encoding Lines in Fourier Transform MRI", Magn. Res. Med. 19, 170–174 (1991);

[37] C. T. W. Moonen, G. Lia, P. van Gelderen, G. Sobering, "A Fast Gradient-Recalled MRI-Technique with Increased Sensitivity to Dynamic Susceptibility Effects", Magn. Reson. Med. 26, 184–189 (1992).

Reference is made hereinafter to a number of these literature references by the use of the identifying number in square brackets [ ].

The rapid MR imaging techniques which are presently being discussed or used in the technical world can be divided roughly into five categories:

(a) Conventional multi-shot sequence methods (e. g. standard spin echo techniques) which fill few points in the K-space [11, 12]. The quite modest shortening of the total measuring time (by a factor of 2 to 4 compared with normal multi-shot sequence spin echo methods) is paid for by a corresponding reduction in the spatial resolution.

(b) Multi-shot sequence methods with flip angles <90°, gradient echo and short repetition time <<T1 (FLASH methods and variations thereof [4, 5]). With this one can achieve a reduction of the total measuring time by a factor of 10 to 1000 as compared with normal multi-shot sequence spin echo methods. These multi-shot sequence methods require, in comparison to the EPI imaging, an increased number of gradient switching points and as a consequence of this an increased total image measuring time with simultaneously reduced signal-to-noise ratio (S/R). This method offers advantages in respect of the distortion-free representation of object regions where there is poor magnetic field homogeneity and the robust representation of movement and flow.

(c) Single-shot sequence methods; for this one is talking about the aforementioned EPI [1], spin echo methods with a rapid succession of echoes through direct succession of the refocusing high frequency pulses (RARE [3]), or methods in which special high frequency excitation pulses are used in the presence of a constant magnetic field gradient, which produce a plurality of echo signals (BURST [9, 10]). With these methods, total measuring times of the order of 10 to 500 ms are achieved. In these single-shot sequence methods, basically the maximum localised resolution and also the achievable signal-to-noise ratio is limited by signal losses, caused by relaxation time effects and diffusion effects. Additionally, image artifacts can occur due to flow and/or movement.

(d) Hybrid methods [6–8, 13–15], in which either several equal multi-echo sequences are repeated (e. g. multi-shot EPI [13]) or in which each spin echo of a single-shot sequence (RARE) is "split" by read gradient reversals into a plurality of gradient echoes (GRASE [6–8]). These methods permit total measuring times of the order of 100 ms to 30 s and offer the advantage of low signal losses and consequently a higher signal-to-noise ratio. Disadvantages include the signal modulation due to this detection method, which can result in ghost images, and also the increased sensitivity to measurement errors due to flow and movement.

(e) Parallel methods in which different signal reception coils are used simultaneously in order to fill different lines of the K-space in simultaneous manner. Such methods (e. g. SMASH [16] or SENSE [17]) can be performed with almost all existing imaging sequences and bring about at the same time an additional reduction of the total measuring time by a factor of about 2 to 8. The disadvantage of these parallel methods lies in the fact that they are up to now not yet technically mature.

An important common feature of all the MR sequence categories (a)–(d) known today is that all MR sequences can be combined as a succession of one or more approximately identical sequences, wherein for the case of the multi-shot sequence methods, each sequence differs only through the degree of the phase coding and other trifling changes from the preceding or subsequent sequence (e.g. changes in the time structure, and also echo time shifting are known, cf. [30, 31]). Thus, for example the FLASH method can be described as a multi-shot sequence method, since this is combined from identical sequences of high frequency pulses, slice gradient and read gradient, in which a phase gradient is increased incrementally in steps only from sequence to sequence. An EPI sequence can correspondingly be defined as a single-shot sequence method, in which the whole of the image information is received in a single sequence. Segmented EPI methods or GRASE methods can likewise be defined as multi-shot sequence methods according to the classification here used, since these likewise combine identical sequence blocks of high frequency pulses, slice gradient and read gradient, in which the value of the phase gradient which is used is changed only from sequence to sequence.

Each of the four method categories (a) to (d) has its own advantages and disadvantages. Each method which offers a particular advantage also shows a series of disadvantages. Different aspects of the image quality, such as contrast, sharpness, signal-to-noise ratio (S/N), contrast-to-noise ratio (C/R), spatial resolution and the occurrence of certain artifacts are emphasized or attenuated to different degrees with the different sequences. Thus, with use of a sequence which emphasises one or more particular aspects of the image quality, one can count on a degradation of at least one of the other aspects. What is practically incontrovertible with the state of the art up to now is the fact that measures which are used for shortening the total measuring time and consequently for accelerating the imaging are often accompanied by a marked degradation of the image quality. This applies to almost all aspects of the image quality. However, artifacts which arise due to movement of the object are often reduced by acceleration of the acquisition of the data.

It is the object of the present invention to provide a method for the acquisition of data for the MR imaging such that a better compromise is achieved than heretofore between various aspects of the image quality or between the speed of data acquisition and the desired aspects of the image quality. This object is achieved in accordance with the invention by the features set out in claim 1. Particular embodiments and developments of the invention are set out in the subsidiary claims. The features of an apparatus according to the invention are set out in claim 18.

With the invention, one can use in a novel manner the realisation that the contrast of an MR image is chiefly determined by the information of low spatial frequency which resides in the middle of the K-space, because the image energy is more strongly concentrated in the center of the K-space. This applies equally to the signal-to-noise ratio and the contrast-to-noise ratio. In the outer regions of the K-space there is a greater frequency of information which contributes more to the resolution of the MR image at its borders. A further effect which is utilisable in a novel manner with the invention is that movement artifacts are so much smaller the further that MR signals received during significant movements are remote from the center of the K-space, cf. [23] to [27].

Correspondingly, the principle of the invention lies in the fact that different conditions are produced in the course of the signal production, because the sequence of at least two different sequences of high frequency pulses and gradient pulses succeeding each other in time are combined, with each sequence differing in at least one of the features of the echo production which is responsible for different aspects of the image quality. The echo signals produced in this way by different sequences are then combined in their own bands of the K-space. Preferably, in order to emphasise a desired aspect of the image quality, a sequence is chosen which is optimum for that aspect, but only the middle band of the K-space is filled with the scanned MR data (echo scan values) of this sequence. The remaining part of the K-space, which contributes less intensively to the overall appearance of the image, is filled on the other hand with the echoes of another sequence which may lay less stress on the particular chosen aspect, but emphasize some other aspect which has a particularly favorable effect on the borders of the K-space. The aforesaid other sequence can be a more rapid sequence in order thus to achieve a measuring time which is shorter overall, without the desired image quality being noticeably poorer and without moving object regions leading to strong artifacts.

The inventive principle is a hybrid method which differs from the known hybrid methods already mentioned above in that different types of sequence and possibly different speed sequences are performed one after another in time and the signals of the different sequences are allocated to separate bands of the K-space. A well-directed, band-type classification of echo groups, which appear in preselected groups of time windows within the total sequence, in pre-selected bands of the K-space, is known it is true in connection with the GRASE method (so called k-banded GRASE), but only within the framework of a single sequence or an unchanged repetition of that sequence. In relation to GRASE it should be mentioned for the sake of completeness that there echo signals of different types are produced which are interleaved in time within each individual sequence, and then can be classified in terms of bands or in some other way in the K-space, and in which the sequence is repeated many times without change.

In spite of the large multiplicity of common MR imaging sequences and in spite of the many endeavors reflected in the aforementioned literature, to produce hybrid forms, a combination method comparable with that of the present invention has until now not been proposed. The reason for this is thought to be the fact that a time-wise switching over between different MR sequences with different signal and contrast characteristics for the formation of a total sequence has not been considered to be feasible technically and moreover would lead to significant image artifacts. It has now been found however that this is a prejudice which has been overcome with the present invention.

A possible further optimising step in a method according to the invention includes the use of the principle of mixed bandwidth, wherein a sequence-dependent change of the bandwidth of the echo readout is brought about. For this, the association of the different bandwidths with the echoes in the K-space read out with different sequences is likewise dependent upon which aspects of the image quality should be emphasized. If for example it is the wish that there should be an edge emphasis in the foreground, then higher readout bandwidths are to be used for the middle region of the K-space than for the outer regions.

The principle of an image sequence according to the invention permits the writing of different sequences of high frequency pulses and magnetic field gradient pulses united in one succession (and thus connected with a change in the echo production and/or changes in the received type of echo), which if planned can be combined also with a change of the bandwidth in the echo readout.

For the practical realisation of a method according to the invention, the skilled person can proceed in the following manner:

1. As the first step, a sequence is chosen as the "main sequence", which has the advantage of being able to produce the desired image contrast in the special particular application.
2. As the second step, at least one other sequence is chosen as the "auxiliary sequence", which has another advantage which is less well achievable than with the first mentioned sequence.
3. In an optimisation step, a proportioning factor $\lambda$ is chosen, which determines how wide the middle band of the K-space which is to be filled by the echo signals of the main sequence should be in comparison with the total width of the K-space. By the optimisation, it can also be decided whether and in what way the bandwidth of the echo readout is changed upon filling of the K-space.
4. The main and auxiliary sequences are carried out one after the other in time (in any order), wherein the echo signals of the main sequence are written into the middle region ($\lambda$) and the echo signals of the auxiliary sequence are written into the remaining part (1-$\lambda$) of the K-space, possibly with varying bandwidth.

The possibility of carrying out an optimisation by variation of the relative widths of the bands of the K-space which are respectively to be filled is an important advantage of the principle of the present invention. The possibility of optimisation by varying the readout bandwidth relieves the sequence designer from the obligation to use equal width time windows (and consequently also equal strength read gradients) for the echo readout.

The aforementioned and further features of the invention will now be described by reference to embodiments which are given by way of example, and partly with reference to the accompanying drawings.

FIGS. 2a and 2b show the plans for the carrying out of two different MR imaging sequences and the trajectories when filling the K-space with the echo signals of these sequences, in the first embodiment;

FIGS. 3a and 3b illustrate a second embodiment, with representations similar to FIGS. 2a and 2b;

FIGS. 5, 6 and 7 illustrate a fourth, fifth and sixth embodiment, with representations similar to FIG. 2a;

It is characteristic of all the embodiments which are to be described hereinafter that the K-space is divided up into bands, which, in accordance with the invention, are filled under different conditions of echo production. The time sequence of the filling of the bands and the orientation of the bands in the K-space can be varied according to the particular application.

Figure 1A:
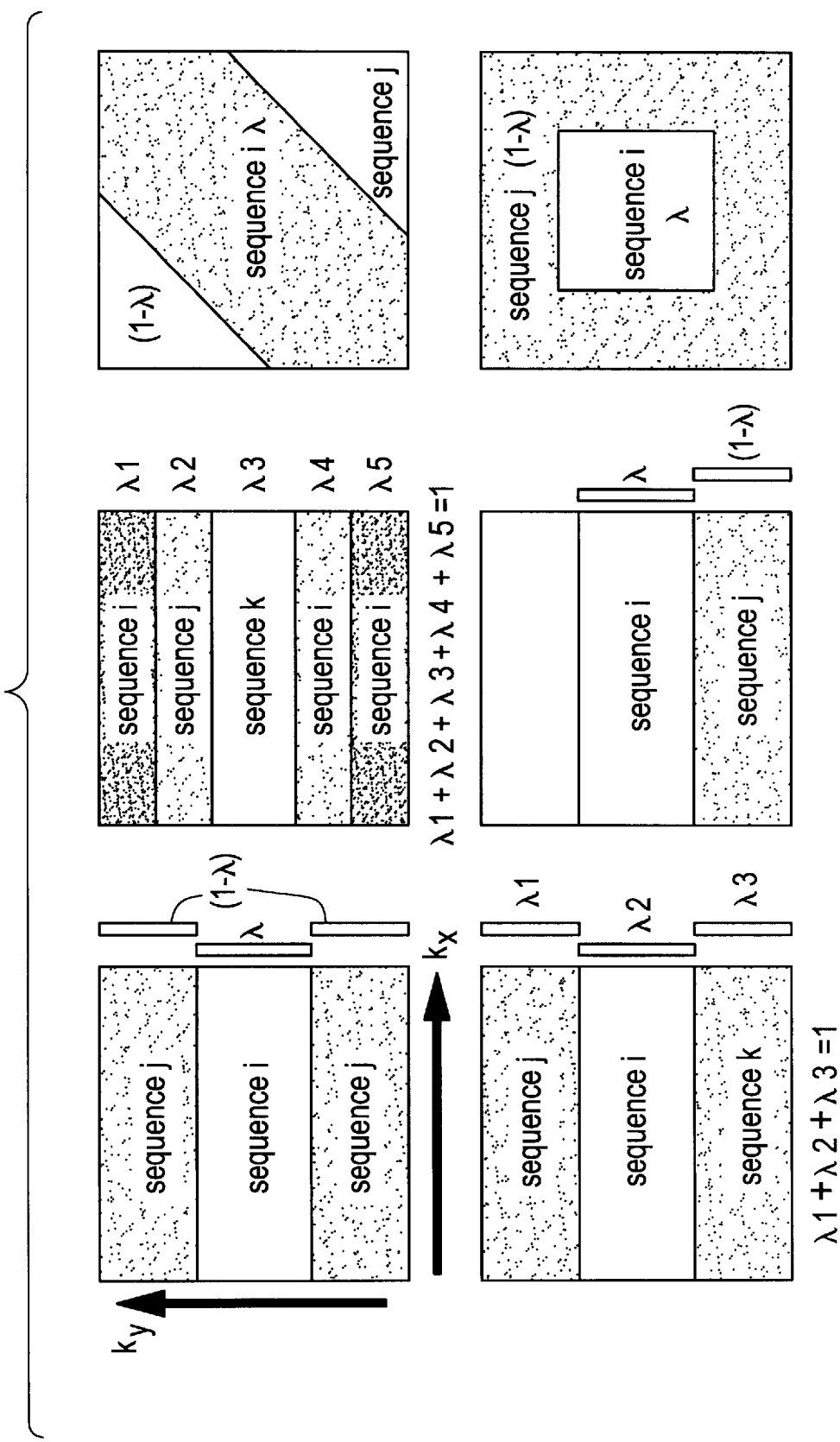
FIGS. 1a to 1d show examples of the division of two-dimensional and three-dimensional K-spaces into different zones for the accommodation of echo signals which, according to the invention, are obtained under different conditions of echo production.
Figure 1B:
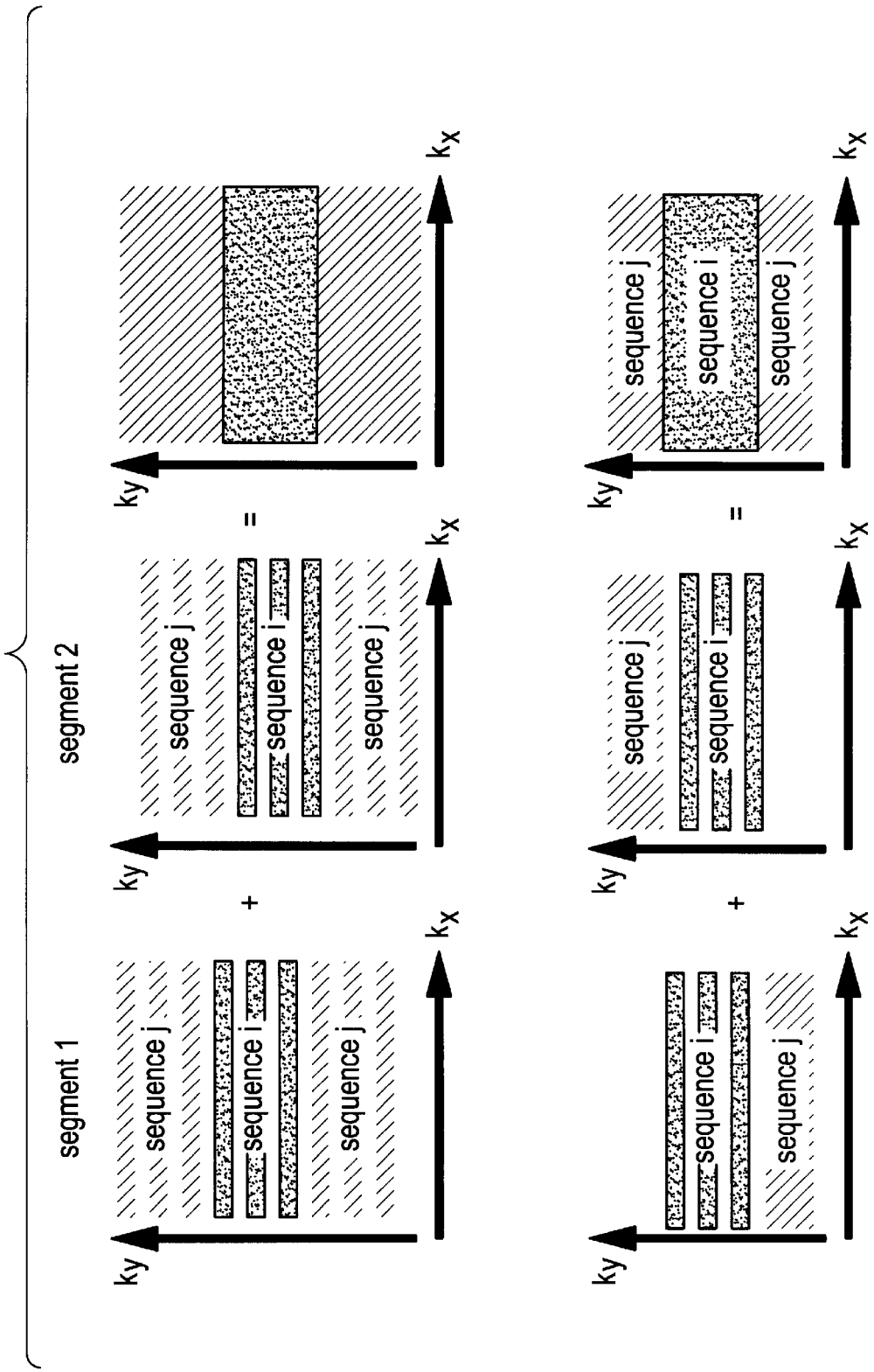

In the individual pictorial representations of FIGS. 1a and 1b, each two-dimensional K-space is shown as a rectangle. It comprises, in the form a two-dimensional matrix, the scan values of successive MR echoes for a two-dimensional imaging. Each echo fills with its temporal successive scan values a line which runs in the direction of the $k_x$-axis (horizontal). This axis is designated as the read axis. The coordinate values of the $k_y$-axis (vertical) which is perpendicular thereto give the measure of the phase coding of the relevant echoes. With the use of the combined frequency and phase coding, mentioned already above, this measure is the time integral of the phase gradient integrated up to the time of appearance of the echo. Correspondingly, the $k_y$ axis is designated as the phase axis.

For the filling of such a K-space, according to the invention different types of sequences of MR signals are produced in succession time-wise, for example two sequences i and j or three sequences i, j and k.

In the upper left-hand diagram of FIG. 1a, the K-space is divided into three bands. The middle band of relative width λ is filled with the signals of a first sequence i, and the two outer bands, which together make up the rest 1-λ of the total width 1, are filled with the signals of a second sequence j. The lower left-hand diagram of FIG. 1a shows a division into three bands with width ratios λ2:λ1:λ3 for three sequences i, j and k. The upper center diagram of FIG. 1a shows an example of how the signals of three sequences i, j and k can be divided into five bands of the K-space. The lower middle diagram in FIG. 1a shows a division of the signals of two sequences i and j into two bands. The two right-hand diagrams in FIG. 1a show likewise a division of the signals of two sequences i and j into different bands of the K-space, wherein parallel band limits extend at an angle to the axes of the K-space (upper right-hand diagram) or wherein one of the two bands surrounds the other on all sides (bottom right-hand diagram). Such a division can be achieved (upper right-hand example) for example by a suitable combination of two gradients which can be used simultaneously for the phase coding and read coding.

In order to achieve an increased spatial resolution, each sequence combination can be repeated one or more times, each with such a displacement of the phase coding that upon the repetition additional lines are filled between the lines previously recorded. The particular chosen K band division can thus remain preserved. Such a "segmentation" is illustrated by two examples in FIG. 1b, where the band division corresponds to that which is shown in the upper left-hand diagram of FIG. 1a.

Figure 1C:
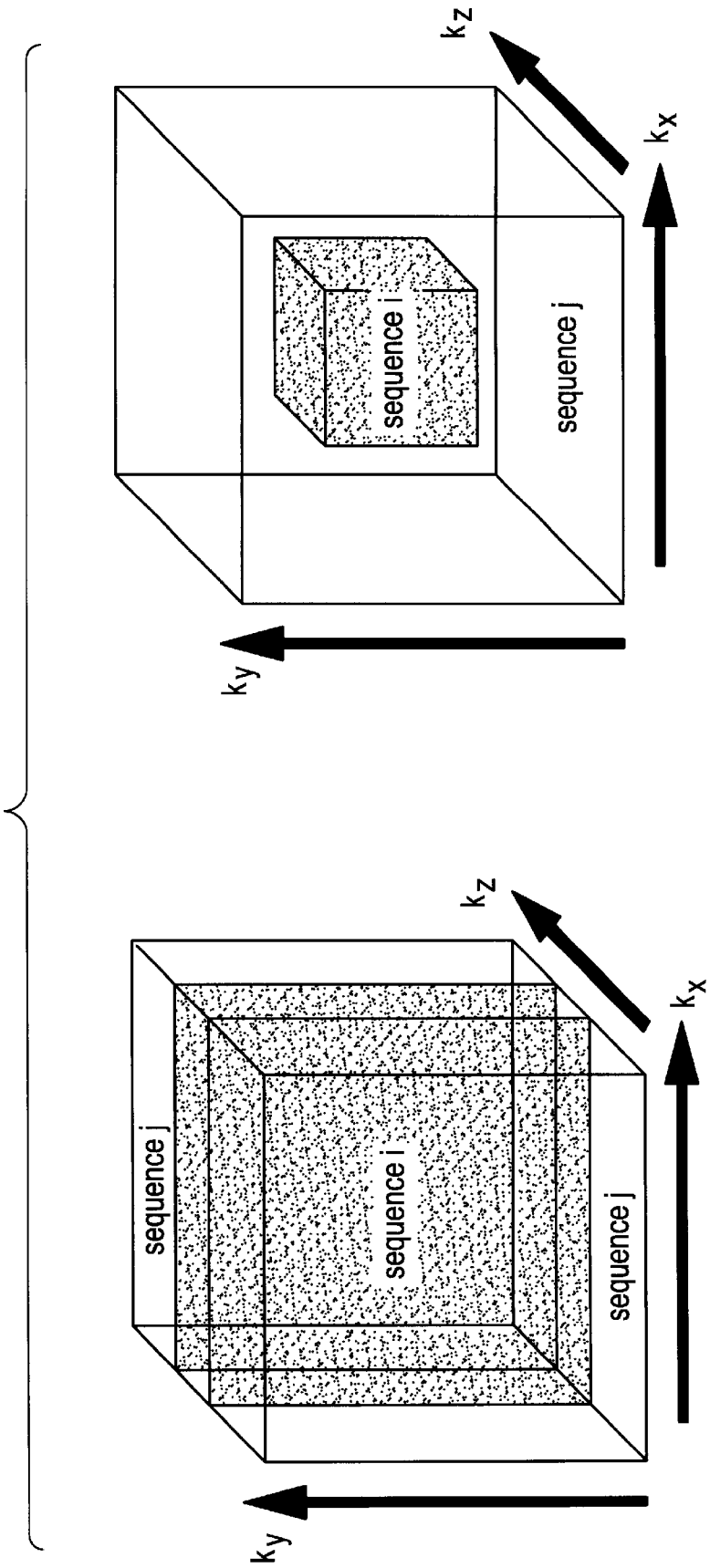

For 3D imaging, a three-dimensional K-space can be used, see FIG. 1c. The characteristic here is that a three-dimensional K-space is divided into "volume bands", which, according to the invention, are filled under different conditions of echo production. The time sequence of the filling of the volume bands can vary according to the particular application.

Figure 1D:
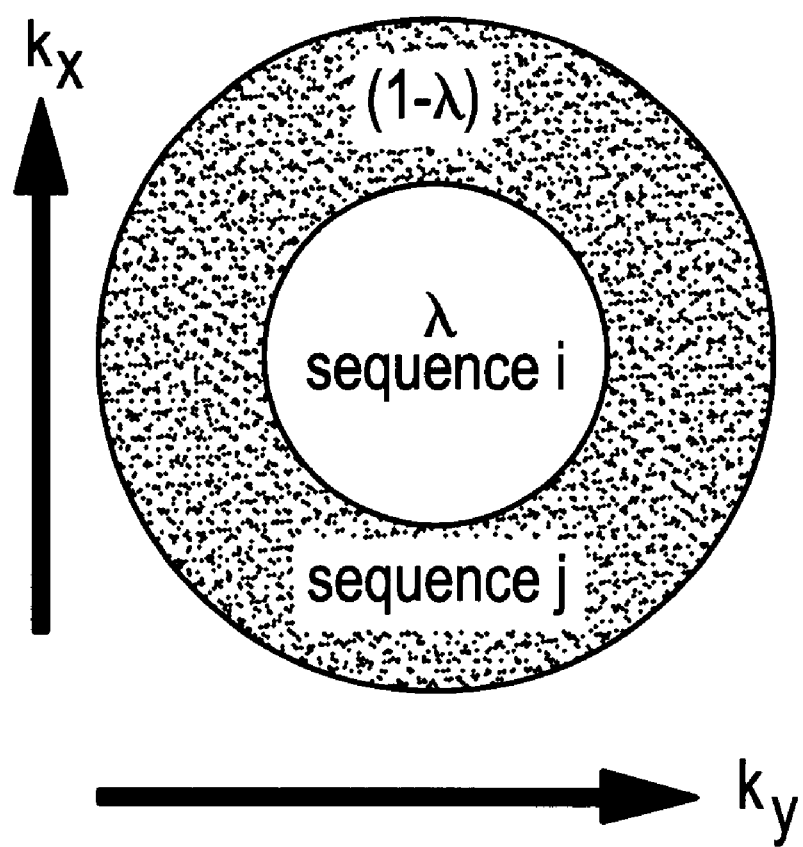

Alternatively, the K-space can be derived from other, non-rectangular coordinate systems, see FIG. 1d, for example from polar coordinates, such as one finds with helical scanning of objects or with the use of so-called projection reconstruction methods with rotating read gradients.

In general terms, the K-space can be defined as an n-dimensional matrix of values which can be transformed by n-dimensional transformation into a matrix of pixel values for an n-dimensional image.

Six embodiments, given by way of example, for the filling of a two-dimensional K-space using the principle according to the invention will now be described with reference to FIGS. 2a, 2b and 3a, 3b and 4a, 4b, 5, 6 and 7.

EXAMPLE 1

Figure 2B:
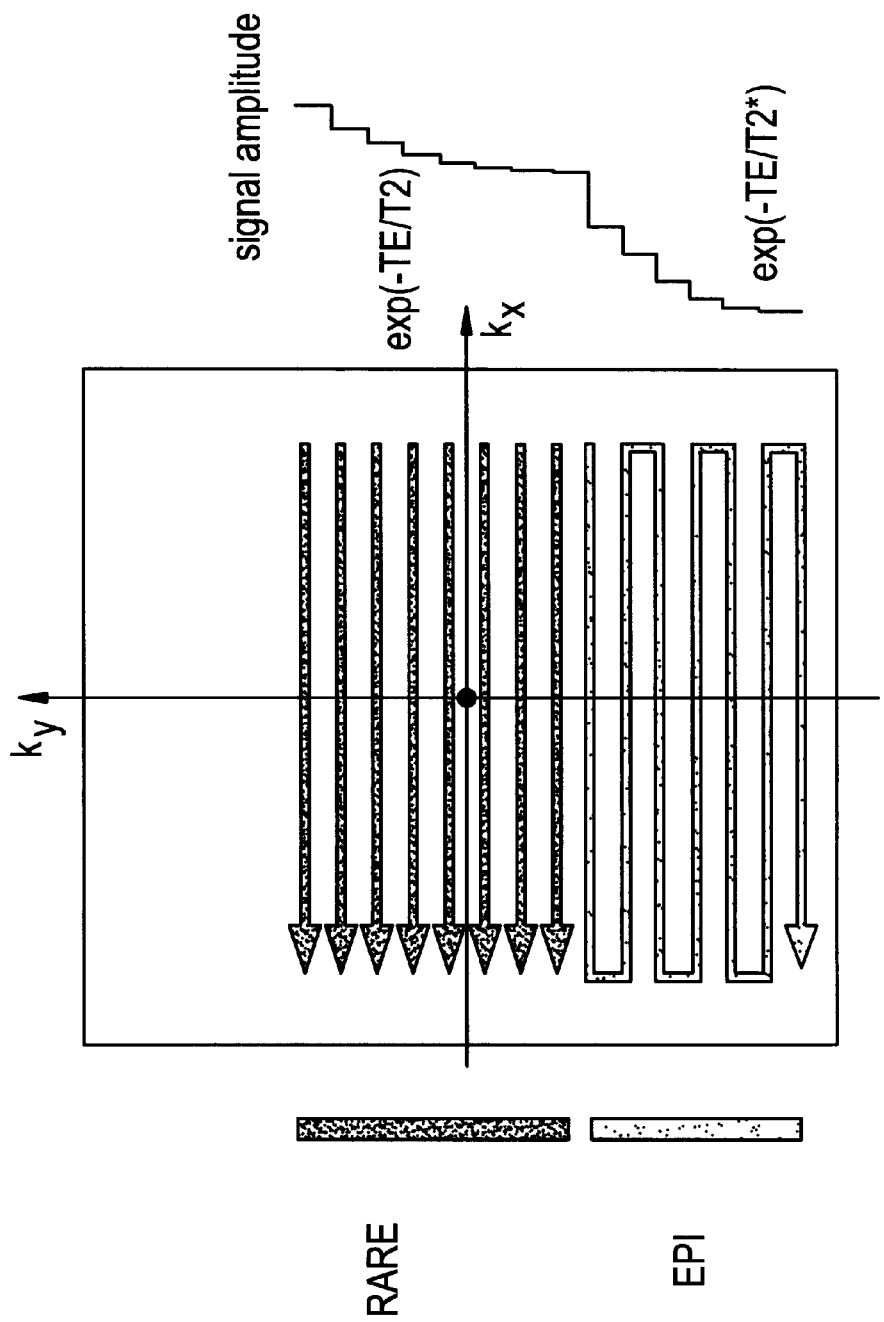

The exemplary method illustrated in FIGS. 2a and 2b combines the advantages of a rapid spin echo sequence (RARE method) with the advantages of echo planar imaging (EPI) in a novel way.

After a high frequency excitation pulse, preferably with a flip angle of 90° and in the presence of a slice gradient, m spin echoes were produced one after another by a train of m 180° refocusing pulses (RARE sequence), with the spin echoes each being scanned in the presence of a read gradient and being recorded on a selected line of the K-space. The choice of the relevant line was effected in the usual way by the dimensions (duration and amplitude) of a phase gradient pulse applied before the echo, whose effect after the echo was neutralised again by a contrary phase gradient pulse ("rewinder" pulse). This phase coding was controlled in the present case so that the aforesaid m spin echoes filled the lines of the middle region or "band" of the K-space. The pursuant trajectories of the K-space are shown in FIG. 2b in the center of the K-space.

After the $m^{th}$ spin echo of the RARE sequence, a further (final) 180° refocusing pulse was then generated (again with slice gradient), and by subsequent application and multiple reversal of polarity of the read gradients in ultrafast succession, a corresponding plurality n of gradient echoes was produced, according to the EPI principle which is known per se. However, in the present case, the phase coding is effected in such a manner that before the first gradient echo a type of "biasing" start phase gradient pulse was applied, and the phase coding of the subsequent gradient echoes was controlled by respective small phase gradient pulses ("blips") of constant amplitude and duration. The magnitude of the phase gradient pulses was so chosen that the EPI gradient echoes filled the outer region of the K-space, according to the lower trajectory shown in FIG. 2b.

The aforementioned start phase gradient pulse determines in which lines of the K-space the trajectory begins. If desired, the whole sequence combination can be repeated one or more times, with the phase gradient pulse of the first (RARE) sequence and the start phase gradient pulse of the second (EPI) sequence being changed such that additional lines or intermediate lines are written in the K-space, while maintaining the K band division between the echo signals of the two sequences. This "segmentation" (already referred to above in connection with FIG. 1b) increases the spatial resolution of the reconstructable image correspondingly.

In comparison to the GRASE method, which receives alternating spin echoes and gradient echoes within each of sequences which are equal to one another and assigns to them specific lines of the K-space, in this exemplary method, first of all, multiple spin echoes within a first sequence are received and then followed by gradient echoes within another sequence, and these are assigned to different bands of the K-space.

The aforesaid embodiment described with reference to FIGS. 2a and 2b has important advantages. As is evident from the diagram in FIG. 2b, at the right-hand side next to the K-space, which shows the modulation of the signal amplitude in the direction of the $k_y$ axis, the effect of T2 and T2* makes itself noticeable in the two sequences in different ways along the $k_y$ axis. The same applies also for frequency shifts as a consequence of magnetic inhomogeneities (off-resonance signals). However, in the direction of the $k_y$ axis there is no rapid modulation on the basis of difference chemical shifts and T2/T2* changes. Rather, in this respect the diagram shows a smooth transition along the whole echo sequence. The stepped signal decay results from the scheme of multiple excitation which is used, since the signal decay due to T2/T2* and the phase shifts of an echo are the same for all excitations.

The results of practical experiments with the embodiment described above are shown in FIGS. 8a and 8b. The RARE/EPI sequence combination according to FIG. 2a was carried out with 9 spin echoes at a spacing of 7.12 ms in the first section and 6 gradient echoes at a spacing of 2.66 ms in the second section. All echo signals were readout with a bandwidth of 390 Hz/pixel. The middle band of the K-space was filled slightly asymmetrically with the 9 spin echoes. The sixth spin echo filled the line in the center of the K-space. The division ratio was thus 9:6, i.e. $\lambda$=9/15=0.6. The effective echo time for the center of the K-space amounted to 44 ms. The acquisition time amounted to 67 ms for the first section and 16 ms for the second section.

Figure 8A:
FIGS. 8a, 8b, 9 and 10 show images which have been obtained from imaging sequences by means of the different embodiments.
Figure 8B:
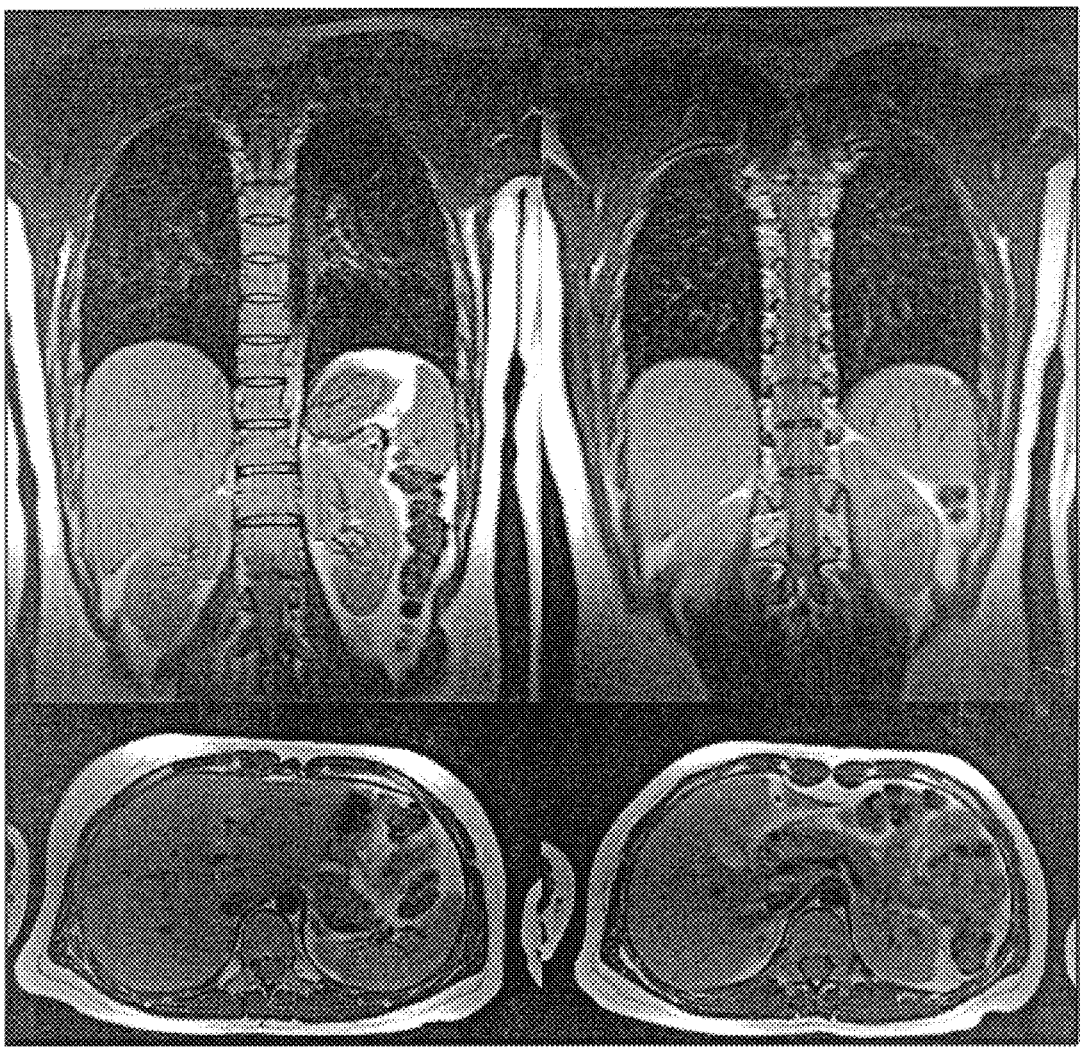

In order to produce section images of the brain, four of which are shown in FIG. 8a, the sequence combination was repeated 20 times with a repetition time TR=3 s (each time with the intermediate switching in of a spoiler gradient pulse to neutralise the preceding coding), in order to fill 300 lines and consequently to obtain, after two-dimensional Fourier transformation of the K-space, an image matrix of 300×512 pixels. In order to produce different section images of the abdominal chamber, four of which are shown in FIG. 8b, the 20 times repetition was carried out with a repetition time TR=1 s.

It is shown in these images that the image quality is uniform overall and no deterioration is to be seen at positions of poor homogeneity of the static magnetic field. Ghost image artefacts, spatial distortions as a result of magnetic field inhomogeneities and artefacts due to chemical shifts are not to be found.

EXAMPLE 2

Figure 3A:
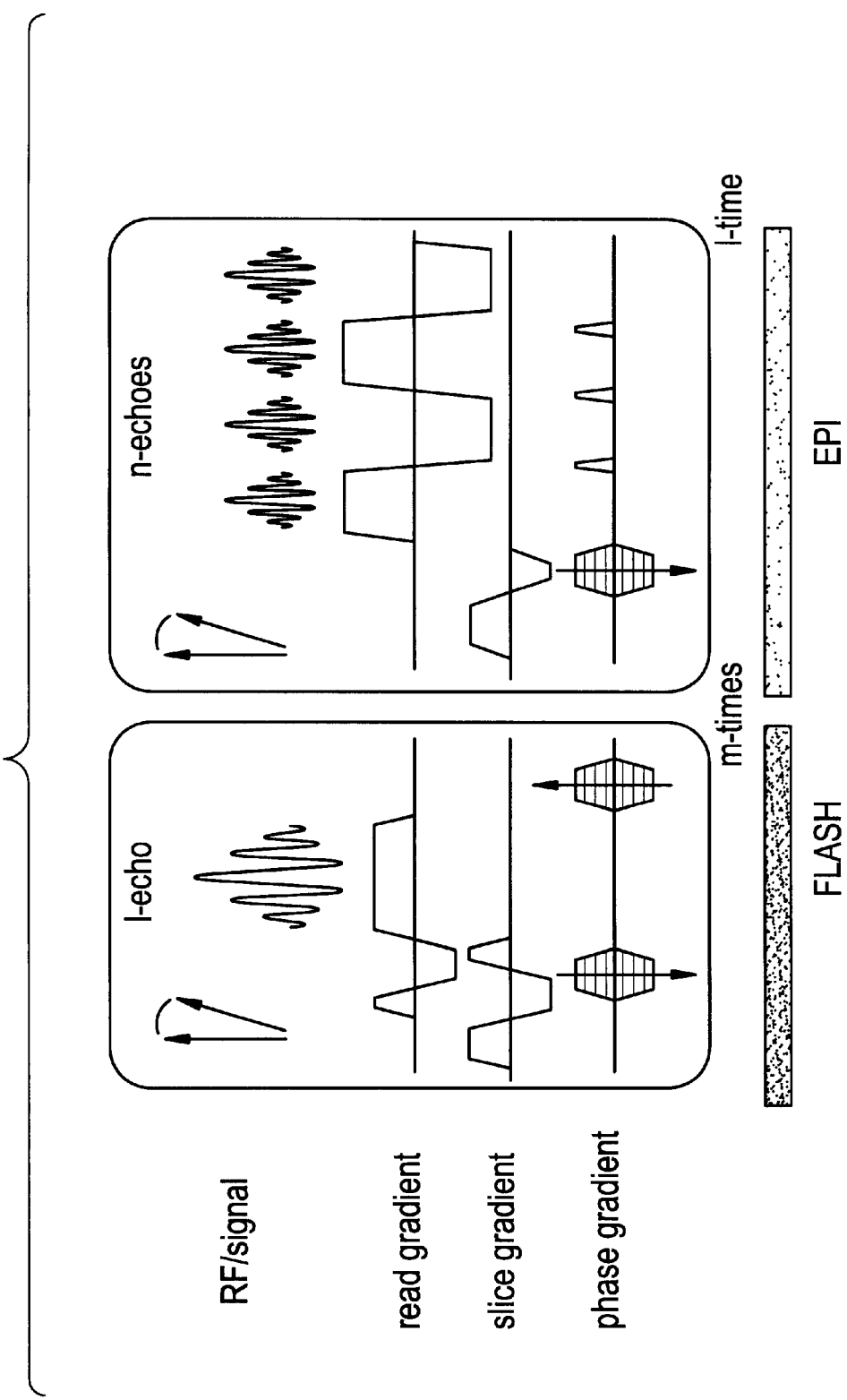

The embodiment illustrated in FIGS. 3a and 3b is an example of the use of the inventive principle for particularly fast image shots. In comparison to the single-shot EPI, signal losses and image deterioration are hereby reduced.

According to FIG. 3a, a sequence of high frequency excitation pulses with flip angles <90° and with short repetition times << T1 was produced, each in the presence of a slice gradient. By transient application and reversal of polarity of a read gradient after each of the first m excitation pulses, a respective gradient echo was produced. This sequence corresponds to the known FLASH method already mentioned above. Each of the m gradient echoes was scanned in the presence of the read gradient and was written into a selected line of the K-space. The choice of the particular line was effected in the usual way by the size (duration and amplitude) of a phase gradient pulse applied before the echo, whose effect after the echo was neutralised again by an opposite phase gradient pulse ("rewinder" pulse). This phase coding was controlled in the present case so that the aforesaid m gradient echoes filled the lines of the middle band of the K-space. The pursuant trajectories of the K-space are represented in FIG. 3b in the center of the K-space.

The FLASH sequence was followed by an EPI sequence. After the (m+1)th high frequency pulse, a corresponding plurality n of gradient echoes was produced by subsequent application and multiple polarity reversal of the read gradient in an ultra fast sequence, according to the EPI principle which is known per se. The phase coding was effected in the same way as for the EPI gradient echoes of the Example 1 described above, so that here also the n EPI gradient echoes filled the outer region of the K-space, according to the lower trajectories shown in FIG. 3b.

In order to improve the image quality still further, additional use is made of the practice already mentioned above of changing the readout bandwidth during the course of the echo sequence. In detail, the readout of the m echoes of the first sequence (FLASH section) is effected with a relatively small bandwidth, using relatively long readout times (low scanning frequency) and a relatively low amplitude of the read gradient. This leads to a better signal-to-noise ratio. The n echoes of the second sequence (EPI section) are read out with higher bandwidth, using shorter readout times (higher scanning frequency) and greater amplitude of the read gradient. This leads to the time-wise shortening of this section and reduces T2*-caused signal losses, image deterioration and artefacts caused by flow and movement phenomena. In the first (FLASH) sequence, additional measures which are known per se can be used in order to compensate for circulation phenomena.

Since the echo sequence of FIG. 3a consists exclusively of gradient echoes, the flip angle of successive excitation pulses can be increased stepwise (the flip angle of the last pulse can then be 90°), in order to drain away the remaining longitudinal residual magnetisation up to the end completely for the excitation. Since it permits the sequence combination shown in FIG. 3a, with a number of excitation pulses smaller than the standard FLASH method (for the same number of echoes), the flip angle can overall be chosen to be larger, so that in addition to the advantage of shorter total measuring time one also achieves the advantage of higher signal strengths and consequently an improved signal-to-noise ratio.

As the diagram of the amplitude modulation in FIG. 3b shows, represented at the right-hand side next to the K-space, T2* has a different effect in the two sequences; the same applies for off-resonance signals caused by inhomogeneities. While there is no modulation in this respect for the echoes of the first sequence, in the second (EPI) sequence there exists a modulation dependent upon T2* and chemical shifts.

Also in the embodiment illustrated in FIGS. 3a and 3b, the "segmentation" already referred to above can be carried out by repeating the whole sequence combination with suitably changed phase gradients.

Results of practical experiments with the embodiment described above are shown in FIGS. 9a and 9b. The FLASH/EPI sequence combination according to FIG. 3a was carried out with 8 gradient echoes in the first sequence (FLASH sequence) and 7 gradient echoes in the second sequence (EPI sequence) ($\lambda$=8/15=0.53). The flip angle was increased in a sequence of steps 18°, 20°, 22°, 25°, 31°, 33°, 38°, 48°, 90°. The acquisition time amounted to 79 ms for the first section and 27 ms for the second section. The echo signals were read out in the first sequence with a bandwidth of 195 Hz/pixel and in the second sequence with a bandwidth of 260 Hz/pixel. The middle band of the K-space was filled slightly asymmetrically with the FLASH gradient echoes, with the sixth echo filling the line in the center of the K-space.

Figure 9:
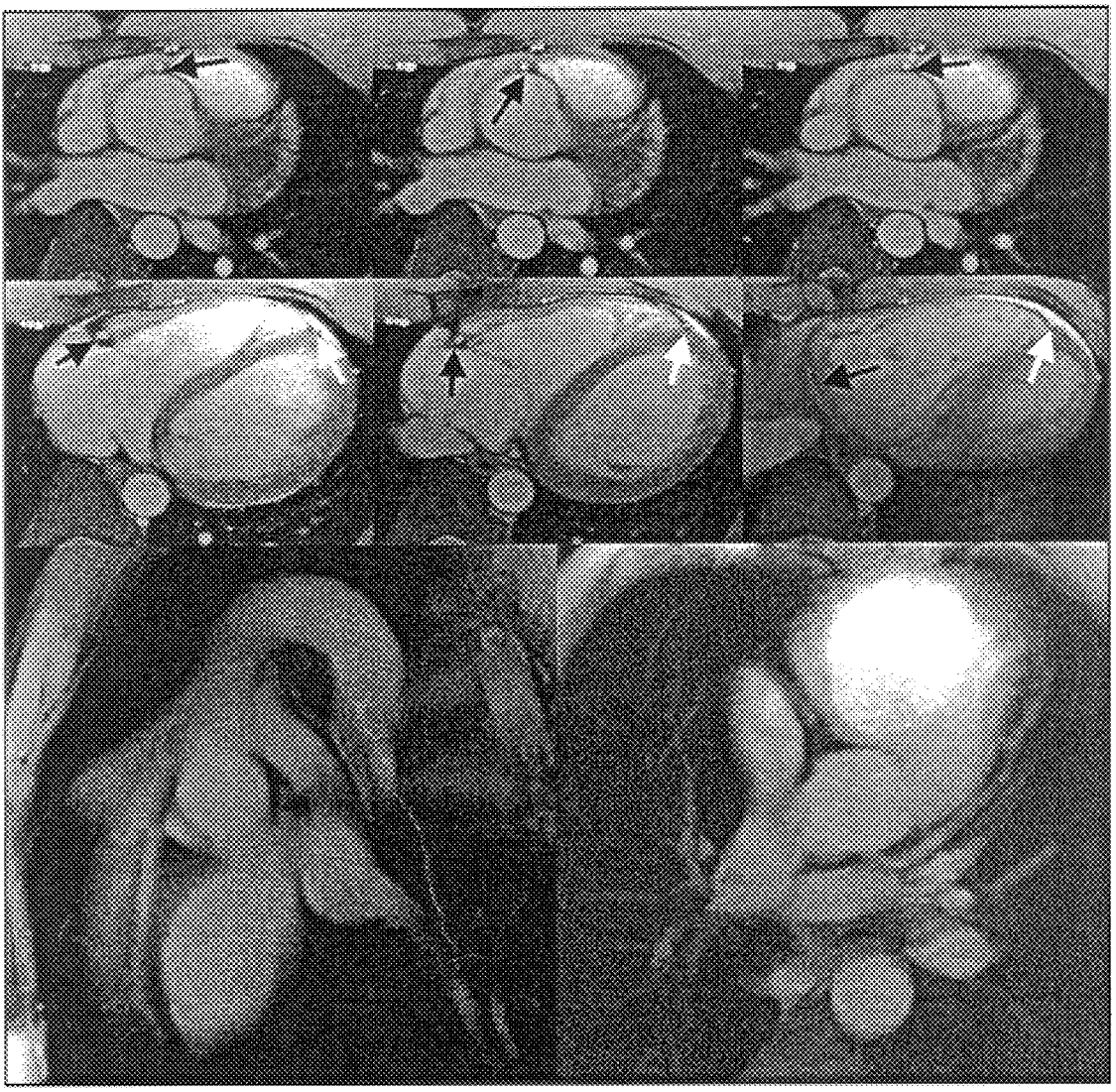

In order to produce section images of the coronary blood vessels, six of which are shown in FIG. 9a, the sequence combination was repeated twenty times for each image, with triggering being synchronised with the heart beat and with the breath held, in order to fill 300 lines in 16 seconds and consequently to obtain an image matrix of 300×512 pixels after two dimensional Fourier transformation of the K-space. Small blood vessels of the left coronary system (black arrows) and right coronary system (white arrows) are imaged with good spatial resolution. In the images, whose spatial resolution is at 800 μm, the small caliber left coronary artery (diameter<<1.5 mm) is itself well resolved.

FIG. 9b shows two different angled sections of the heart, taken under the same conditions as the images of FIG. 9a. In the left-hand image of FIG. 9b one can well see a long segment of the right coronary artery, which runs vertically close to the center of the image. In the right-hand image, the left main coronary artery is to be seen close to its aorta exit.

The experiments verify that FLASH/EPI sequence combination according to the invention is a rapid and robust method for obtaining data for images of mobile objects (blood vessels) which have flows therethrough. The signal-to-noise ratio for blood (average signal strength of the blood divided by the standard deviation of the background intensity) is about 40, according to measurements at the left ventricle.

EXAMPLE 3

Figure 4A:
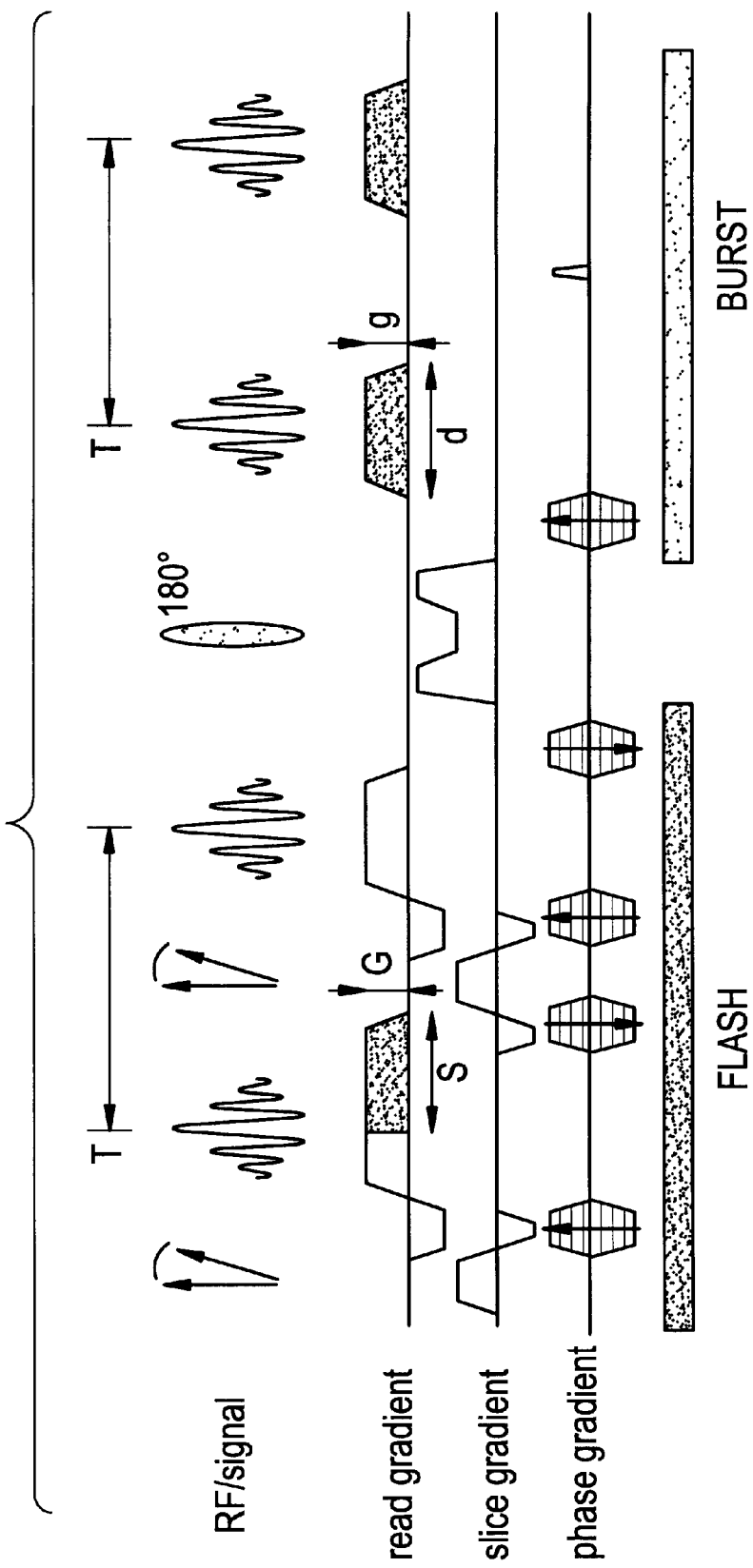
FIGS. 4a and 4b illustrate a third embodiment, with representations similar to FIGS. 2a and 2b.
Figure 4B:
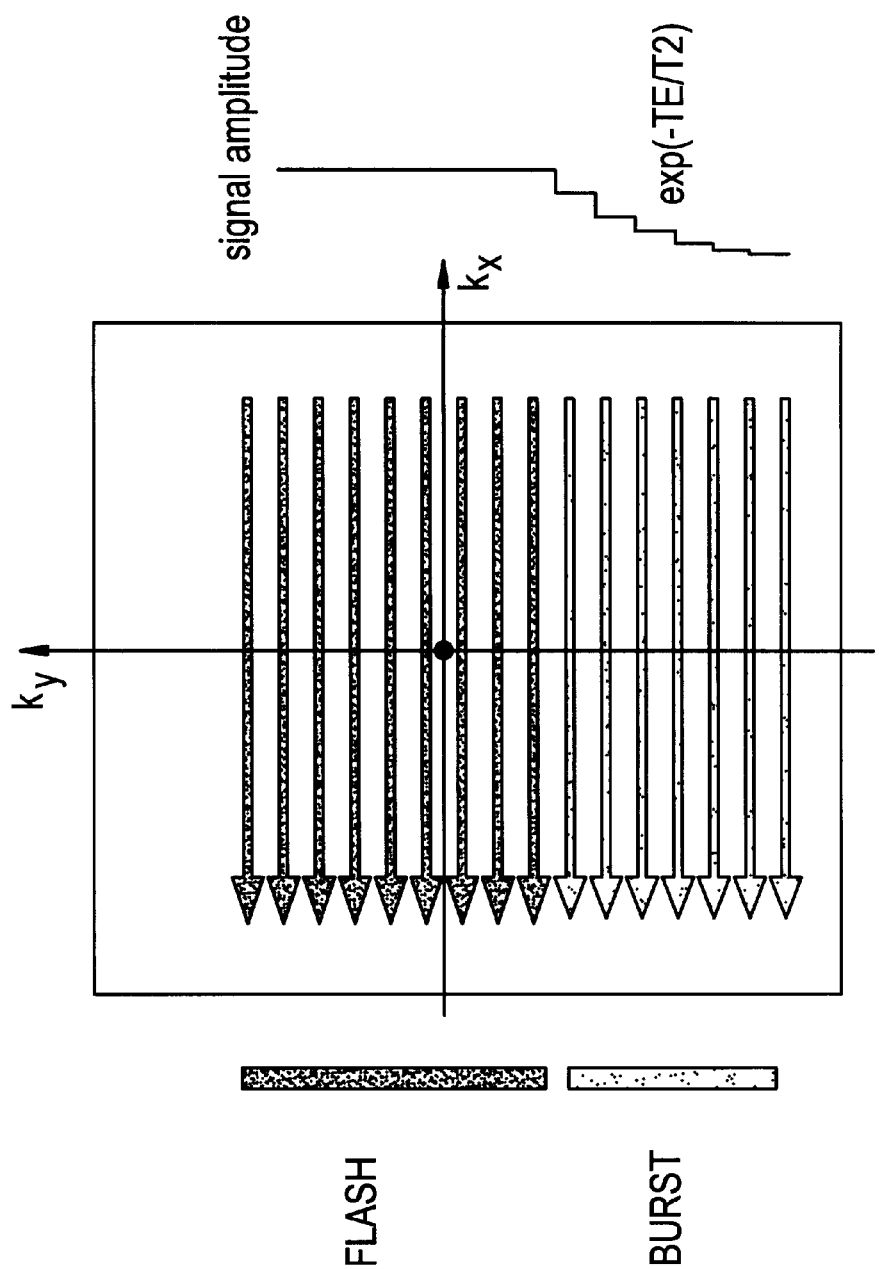

In this embodiment which is shown in FIGS. 4a and 4b, in a first sequence, m gradient echoes were produced in the same way, were read out and were written in the middle band of the K-space, as in the first sequence of Example 2. This FLASH sequence follows a refocusing high frequency pulse (ideally: flip angle 180°), and a subsequent series of read gradient pulses with which spin echoes are coded whose appearance times are symmetrical with respect to the gradient echoes of the first sequence in relation to the refocusing pulse (so-called BURST sequence, as is known per se from references [9, 10]). These spin echoes were phase coded by matching phase gradient pulses and were then read out, such that they filled the outer regions of the K-space (see FIG. 4b). In a similar way to the respective second (EPI) sections of Examples 1 and 2, here also the phase coding was effected by a start phase gradient pulse and later gradient "blips".

In the realisation of this sequence combination, the read gradient pulses of the first sequence and of the second sequence are balanced out in relation to one another such that the location-dependent phase shifts of the first (FLASH) sequence caused by the read gradients are made to be cancelled exactly by the read gradient pulses of the second (BURST) sequence. The following equation fulfils this:

$$\int_{t=0}^{S} G(t)\,dt = \int_{t=0}^{d} g(t)\,dt,$$

where G is the amplitude and S is the duration of each read gradient pulse in the first sequence, measured from the center of the relevant echo signal up to the end of the pulse, and where g is the amplitude and d is the duration of each read gradient pulse during the second sequence.

The m echoes appearing in the first sequence have constant echo time $TE_F$ (spacing of the excitation pulse from the echo center) and a mutual spacing T. The echoes appearing in the second sequence have different echo times $TE_B$ and likewise the mutual spacing T. T2* acts differently in the two sequences; the same applies for the off-resonance signals due to inhomogeneities. In the case of the echoes of the first sequence, there is however no modulation in this respect; in the second sequence there only exists a modulation dependent on T2 (see the diagram of the signal amplitude on the right-hand side of FIG. 4b next to the K-space).

This FLASH/BURST variant was developed in order to demonstrate that combinations of different types of sequence, corresponding to the method of the present invention, can be combined into one technically feasible imaging sequence. Again in the embodiment which is illustrated in FIGS. 4a and 4b, the "segmentation" already referred to above can be carried out by repeating the whole sequence combination with correspondingly changed phase gradients.

Figure 10:
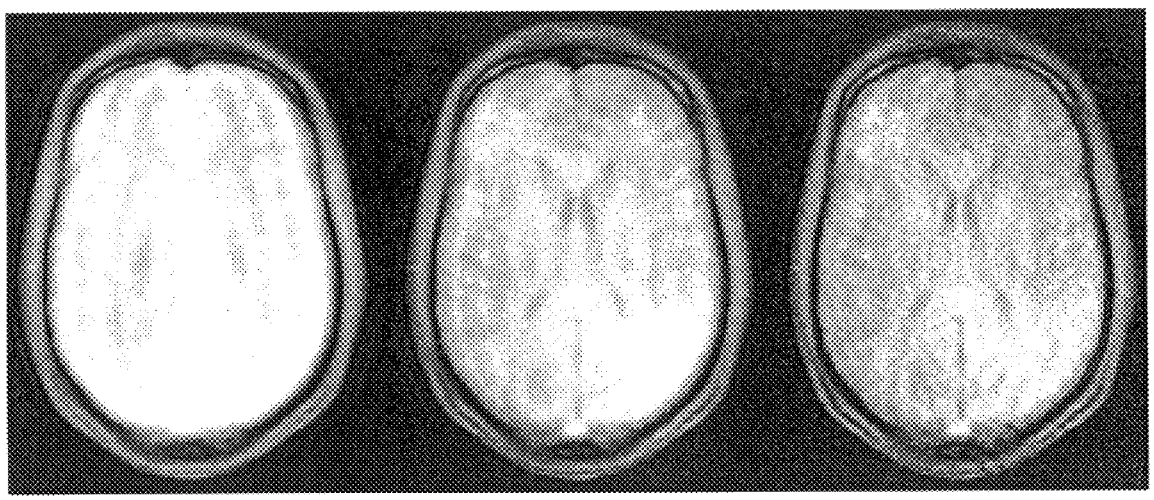

The results of practical experiments with the embodiment described above are illustrated in FIG. 4c and in FIG. 10. The FLASH/BURST sequence combination according to FIG. 4a was carried out with 8 FLASH gradient echoes at a spacing of 4.5 ms in the first sequence and 7 BURST spin echoes with a spacing of 4.5 ms in the second sequence (λ=0.53). For the excitation in the FLASH sequence, high frequency pulses with a flip angle of 10°, a duration of 500 μs and a sinc envelope curve were used, i.e. corresponding to the function (sin x)/x. The 180° refocusing pulse had a width of 2560 μs. The echo time $TE_F$ in the first sequence amounted to 2.1 ms. For the second sequence there resulted different echo times TEb of 39.9 to 66.8 ms. Each sequence occupied an acquisition time of 35 ms, so that there was 70 ms total measuring time for the sequence combination. All echo signals were read out with a bandwidth of 780 Hz/pixel. The middle band of the K-space was filled slightly asymmetrically with the FLASH gradient echoes, with the sixth echo filling the line in the center of the K-space. The whole sequence combination (15 echoes) was repeated ten times with TR=1000 ms (i.e. ten line-interleaved "segments").

Figure 4C:
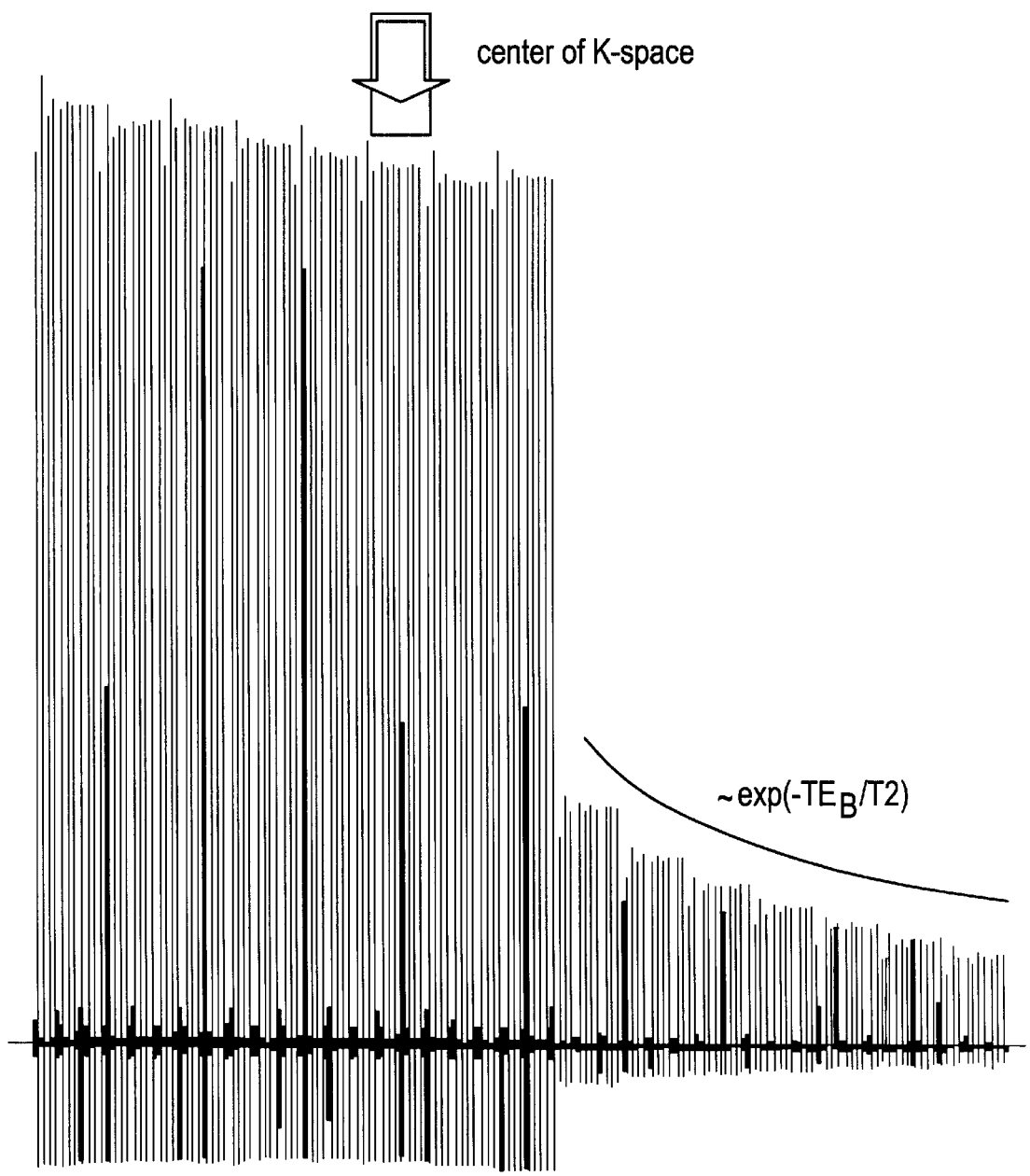
FIG. 4c shows, in detail, the amplitude modulation along the phase axis of the K-space in a practical performance of the third embodiment.

FIG. 4c shows the distribution of the single intensities in the K-space (amplitude modulation along the $k_y$ axis) in this experiment. The gradient echoes of the FLASH sequence have approximately constant amplitude (on account of the small flip angle). The spin echoes of the BURST sequence show the expected damping as a result of the T2 relaxation. The amplitude of the BURST echoes, smaller by about a factor of 3, is explained by the signal loss which is due to the spatial selectivity of the single-phase FLASH excitation.

FIG. 10 shows sectional image shots b, c and d of the brain for the aforesaid sequence parameters. In the image shot b, the (BURST) sequence was omitted for comparison purposes; the consequential unwritten 70 lines of the K-space were filled with zero signals. In the image shot c, the whole FLASH/BURST sequence combination was carried out, and in the case of the image shot d, there was additionally an amplitude correction of the BURST echo signals. A comparison of the images shows the clear gain in spatial resolution and the better emphasis of fine structure by the inclusion of the BURST sequence, particularly with the inclusion of amplitude correction. However, in the latter case, a reduced signal-to-noise ratio was to be observed, which has its origin in the intensification of the noise component by the amplitude correction.

EXAMPLE 4

Figure 5:
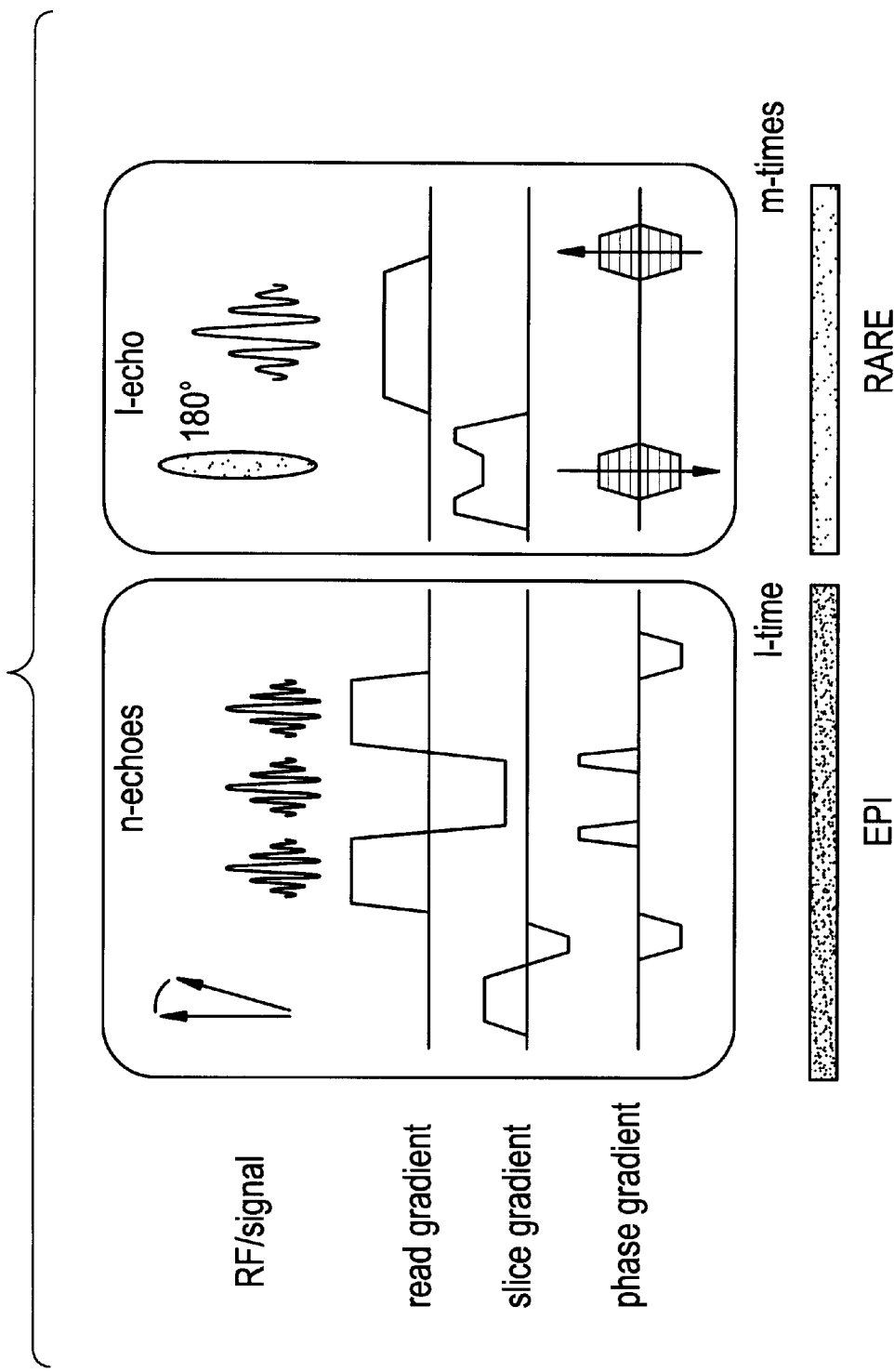

The method which is shown by way of example in FIG. 5 combines the advantages of an EPI sequence with a RARE sequence. After a high frequency excitation pulse, preferably with a flip angle of 90° and in the presence of a slice gradient, by multiple reversals of the read gradient in rapid succession, a corresponding plurality n of gradient echoes was produced, according to the EPI principle which is known per se. After the $n^{th}$ gradient echo of the EPI sequence, m spin echoes were produced by a train of m refocusing pulses, preferably 180° pulses, and in the presence of a slice gradient. The phase coding was controlled in the present case so that the aforesaid gradient echoes filled the middle band of the K-space, while the spin echoes filled the outer bands of the K-space. This EPI/RARE method can be usefully employed for specific applications, such as for example the functional or diffusion-weighted MR image shots.

EXAMPLE 5

Figure 6:
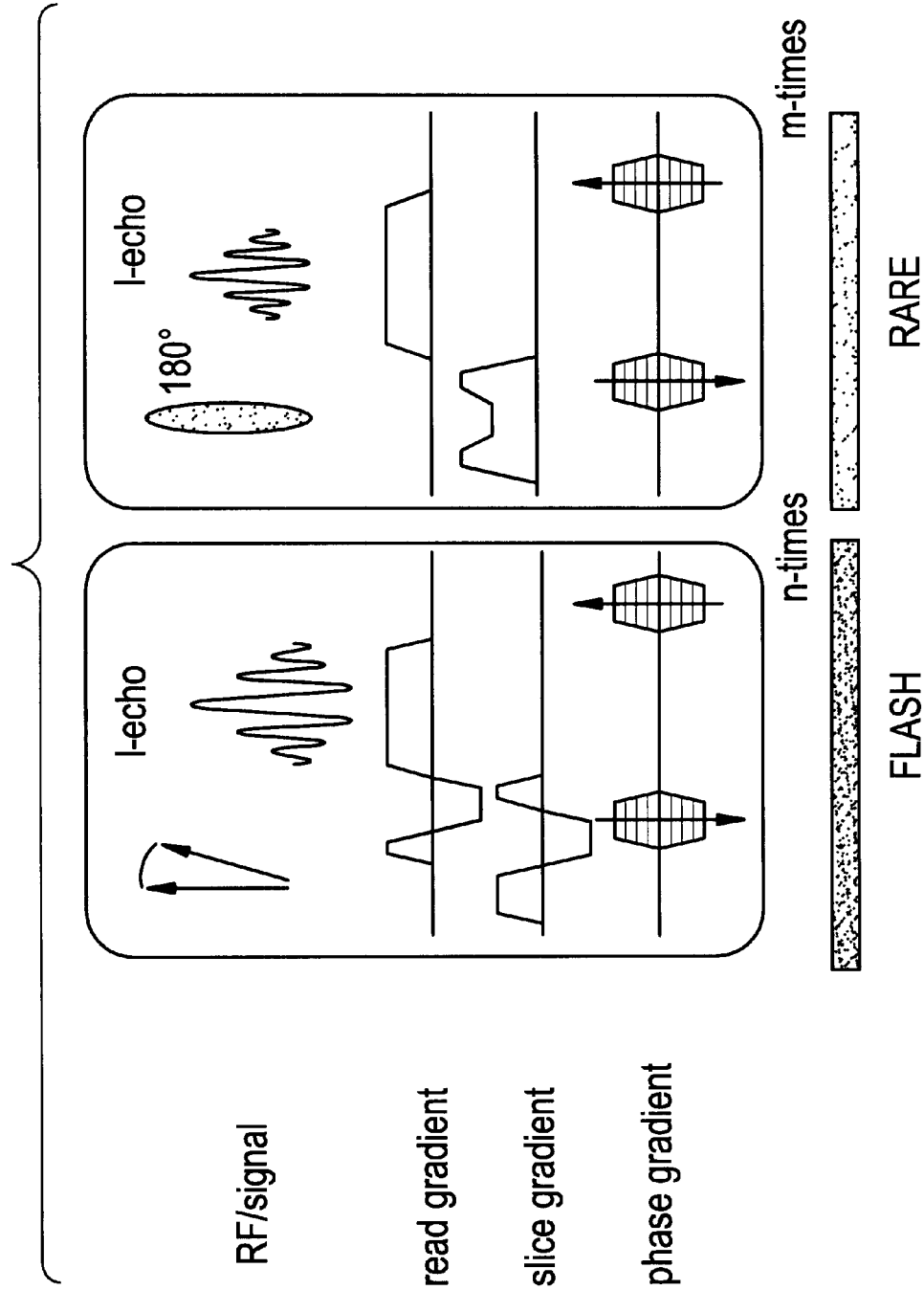

The method which is shown by way of example in FIG. 6 combines the advantages of a FLASH sequence with a RARE sequence. Here, n gradient echoes were produced after a high frequency excitation pulse, according to the known FLASH principle. After the $n^{th}$ gradient echo of the FLASH sequence, a succession of m spin echoes were produced by a train of m refocusing pulses, preferably 180° pulses, and in the presence of a slice gradient. The phase coding was in the present case controlled so that the aforesaid gradient echoes filled the middle band of the K-space, while the spin echoes filled the outer bands of the K-space.

EXAMPLE 6

Figure 7:
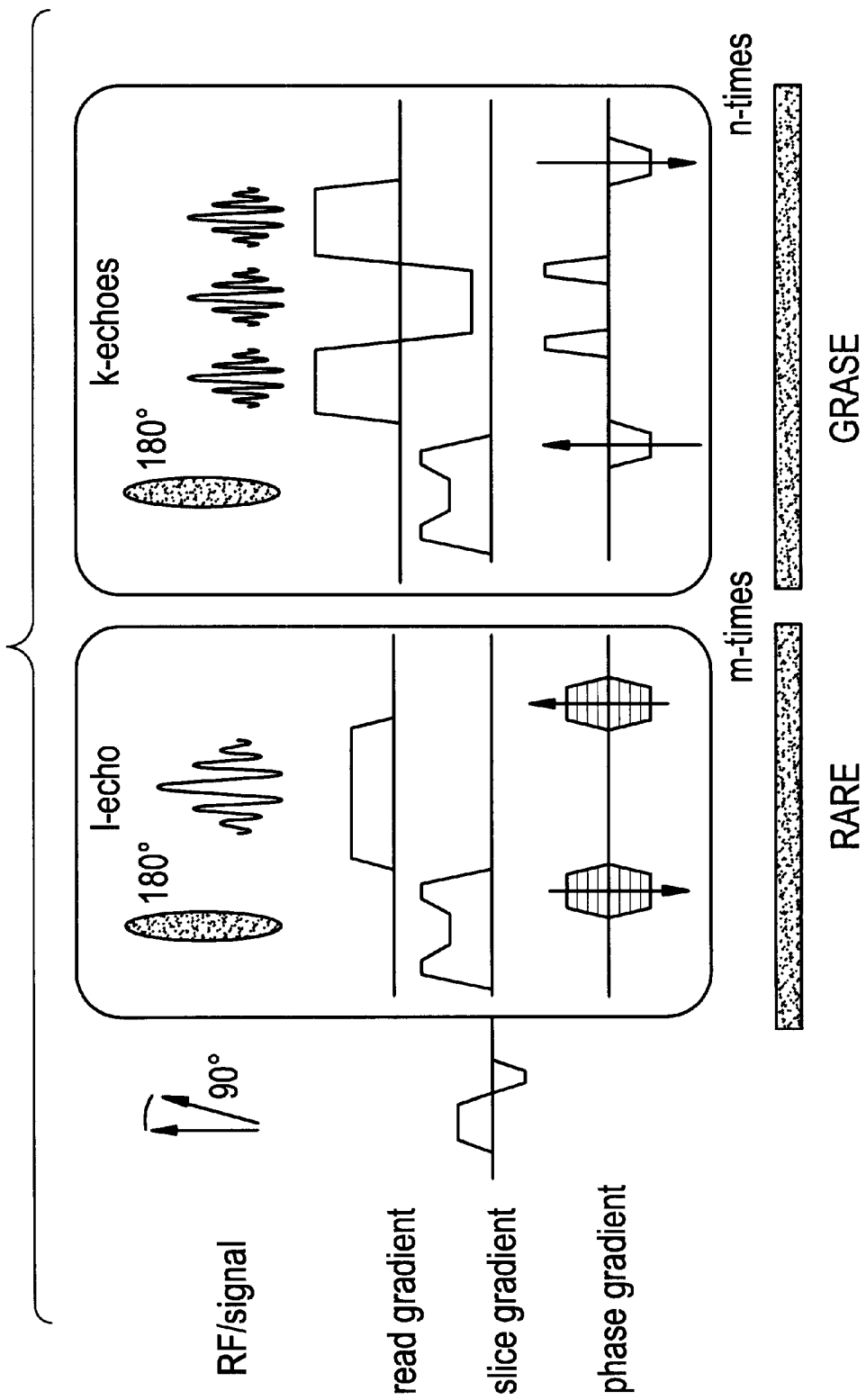

The method which is shown by way of example in FIG. 7 combines a RARE sequence with a GRASE sequence. After a high frequency excitation pulse, preferably with a flip angle of 90° and in the presence of a slice gradient, a succession of m spin echoes was produced (RARE sequence) by a train of m 180° refocusing pulses, with each spin echo being scanned in the presence of a read gradient and being written in a selected line of the K-space. After the $m^{th}$ spin echo of the RARE sequence, n further 180° refocusing pulses were applied (likewise with slice gradient), wherein after each refocusing pulse, by subsequent application and multiple reversal of the read gradient, a corresponding plurality k of gradient echoes was produced, according to the GRASE principle which is known per se, and these were written in selected lines of the K-space. This sequence combination is particularly suitable for the creation of very high resolution MR images in short measurement times.

Besides the embodiments described above, there are naturally many other sequence combinations which are possible within the scope of the present invention. Thus, a rapid single-echo sequence with gradient echoes, somewhat according to the FLASH principle, could alternatively be used in order to fill the outer regions of the K-space, while the middle band is filled with the gradient echoes of an EPI sequence or with the spin echoes of a RARE sequence. In order to fill the middle band, one could alternatively use a multiple-echo sequence with spin echoes or spin and gradient echoes, for example according to the GRASE principle.

Alternatively, a multiple-echo sequence could for example be used, somewhat according to the segmented EPI principle, in order to fill the outer or middle bands of the K-space, while the middle or outer regions are filled with for example gradient echoes of a FLASH sequence.

Alternatively, quite special sequence variations, such as for example echo shifting [37], in which in a single sequence with gradient echoes the gradient echo signal is shifted in a succeeding sequence period, can be used to fill the middle/outer regions of the K-space.

The present invention includes basically any combination of all conceivable different sequences, even more than two (see for example the distribution scheme in the upper middle image of FIG. 1a). Furthermore, in one or more of the sequences not only gradient echoes and spin echoes can be separated out, alternatively or additionally, but stimulated echoes can also be acquired. With sequence combinations in which the second sequence contains no proper excitation pulse, but the excitation is refocused from the first sequence (by high frequency or gradient reversal), the first sequence is preferably the one with whose signals the middle band of the K-space is filled.

The change of the readout bandwidth can be effected with any sequence combination which is used. The change of the readout bandwidth can be effected either continuously from echo to echo according to any desired function or alternatively within one echo readout.

The embodiments described above relate to the filling of a rectangular cartesian two-dimensional K-space. However, the principle of the invention permits one to combine different cartesian and polar image raster techniques without difficulty, and also to use 3-dimensional techniques, see FIGS. 1c and 1d.

Overall, with the invention there is created an extremely flexible concept for the obtaining of data for the MR imaging, which offers the possibility of maintaining the best possible image quality for any particular use. The different acquisition strategies for different bands of the K-space applied in rapid sequence in accordance with the invention can be optimised individually and independently of one another.

Figure 11:
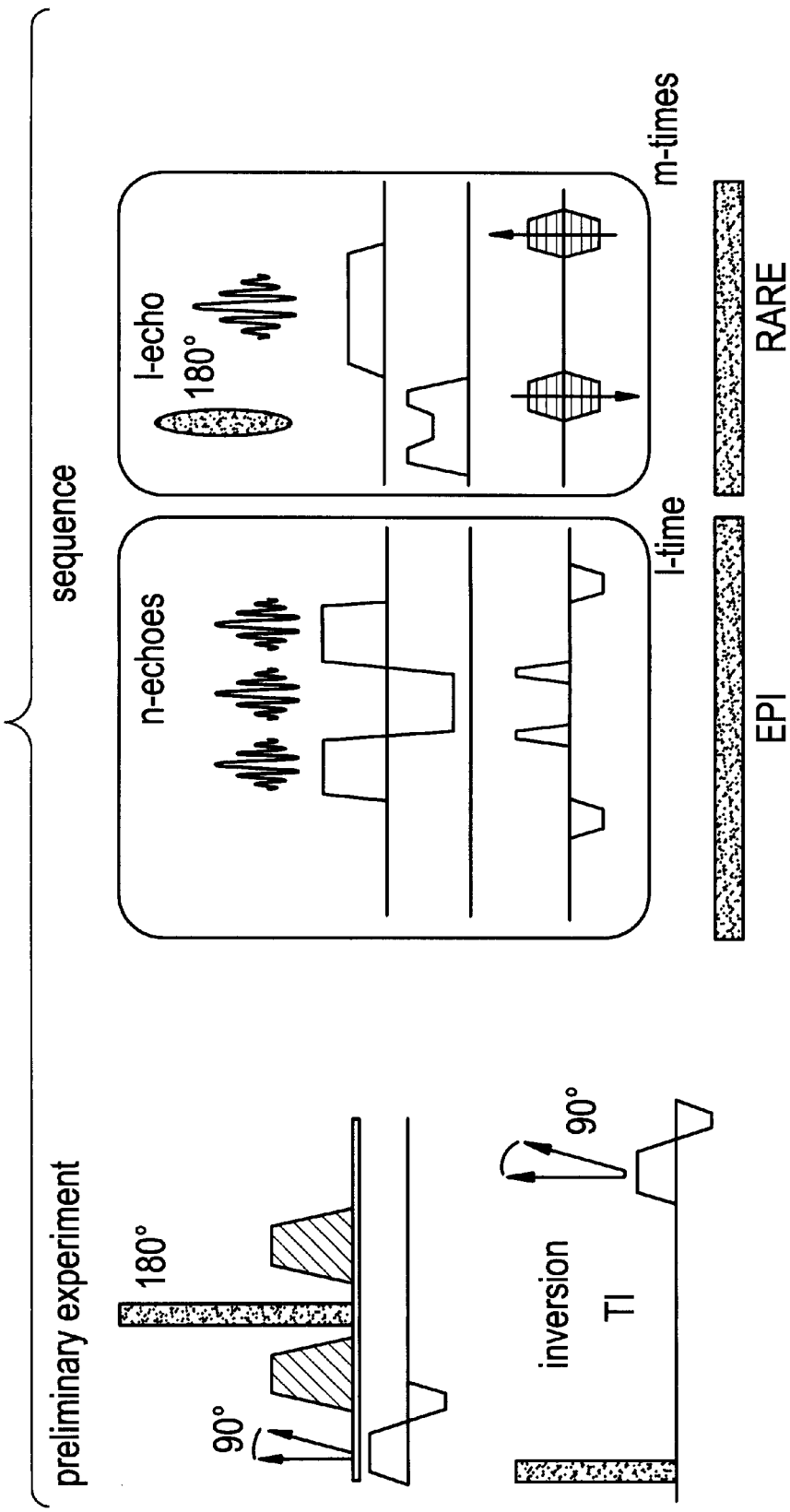
FIG. 11 illustrates the carrying out of a method in accordance with the invention incorporating preliminary experiments.

Additionally, the methods according to the invention can be combined with any preliminary experiments (for the preparation of the magnetisation), see FIG. 11 which shows as an example two different preliminary experiments in the left-hand half of the Figure. In the cases shown there, the preliminary experiments consist of either a spin echo preliminary experiment which is known per se (90°–180° preliminary experiment) for the diffusion weighting, with a diffusion gradient pulse before and after the 180° refocusing pulse and with a slice gradient (top left-hand corner of FIG. 11) or else consists of a 180° inversion pulse followed by a waiting time T1 up to the T1 weighting (bottom left-hand corner of FIG. 11). The preliminary experiments are shown as an example in combination with an EPI+RARE sequence combination (similar to that shown in FIG. 5), but they can naturally be effected alternatively with any other sequence combination according to the invention.

Methods according to the invention can equally well be combined also with preliminary experiments for the T2-, T2*-, T1 weighting, or flow weighting or with preliminary experiments for the production of magnetisation transfer contrast (MTC) or with preliminary experiments for suppressing the water or fat components of a tissue. Such preliminary experiments are sufficiently known from the literature of this field not to need further explanation.

Figure 12:
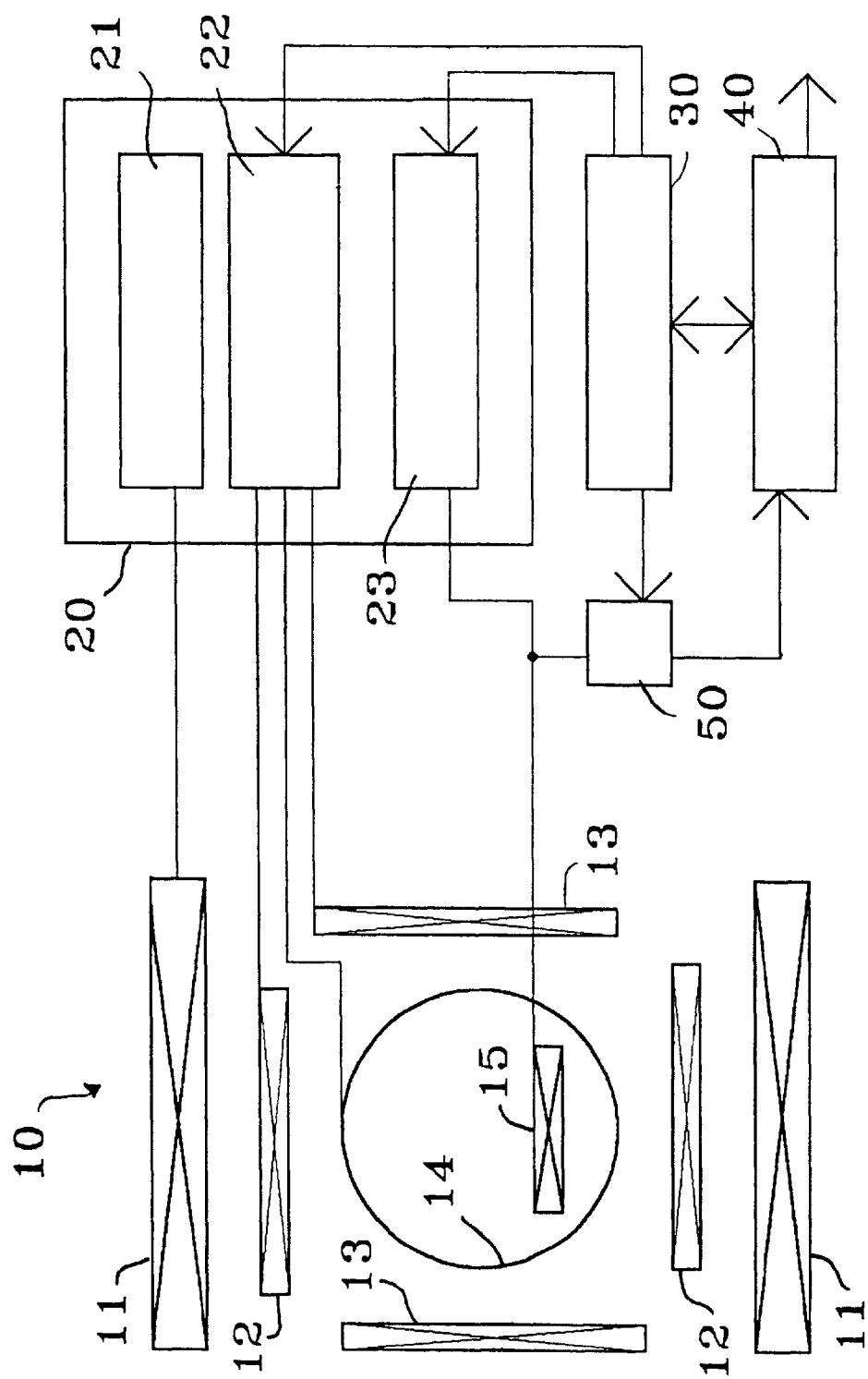
FIG. 12 shows a block schematic diagram of an apparatus for the carrying out of methods according to the invention.

Methods according to the invention can be carried out with a spin resonance apparatus, as is shown in the greatly simplified block diagram of FIG. 12. The illustrated MR apparatus comprises a measuring station 10, a current supply device 20, a control device 30 and a computer 40. The measuring station 10 can, as is usual, include a magnet 11 for the creation of a constant, homogeneous ("longitudinal") $B_0$ field, and also sets of coils 12, 13, 14 for the creation of three gradient magnetic fields which are substantially perpendicular to one another. Normally, one of these extends parallel to the $B_0$ field and the other two extend perpendicular to the $B_0$ field. In the measuring station 10 there is also provided a coil arrangement 15 to which high frequency pulses can be supplied, including among others the high frequency pulses required for the excitation and for the refocusing of transversal magnetisation This high frequency coil 15 serves in general also for the receiving of MR signals radiated by the object. The current supply device 20 includes a current supply unit 21 for the $B_0$ magnet, a current supply unit 22 for the gradient coils 12, 13, 14 and a high frequency generator 23 which supplies the high frequency pulses for the coil 15. The control device 30 controls the duration and amplitude of the currents supplied to the respective gradient coils, as well as the duration, amplitude, frequency and envelope curve of the high frequency pulses. The control device 30 also controls the readout of the MR signals received by the high frequency coil 15, sending these to the computer 40 in selected time periods and with selected scanning frequency, as is symbolised by the illustrated gate circuit 50. The read out scan values are digitalised and fed into a store forming the K-space. The analogue to digital converter needed for the digitalisation and also the store can be integrated into the computer 40.

MR installations of this type are known and are available commercially, so that a further explanation of the details of the apparatus is unnecessary. In order to carry out a method in accordance with the invention the object to be investigated is brought into the space enveloped by the $B_0$ coil and gradient coils 11, 12, 13, 14, and the high frequency coil 15 is arranged so that the region of the object which is to be investigated lies within its field of influence. Then, in accordance with a chosen program, which has been fed into the control device 30, the high frequency generator 23, the gradient coil supply unit 22 and the readout circuit 50 are controlled in order to generate the required high frequency pulses and gradient pulses for selected imaging sequences and to read out the echo signals which appear. The computer 40 generates the pixel matrix for the image reproduction from the data written into the K-space store by mathematical transformation.

The control device 30 for measuring the time, frequency and amplitude parameters for the high frequency pulses, the gradients and the echo readout is so constructed and programmed that the procedures for obtaining data run in accordance with the particular chosen embodiment of the method of the invention. The control device 30 can of course likewise be integrated into the computer 40, either wholly or partially.

What is claimed is:

1. A method for the acquisition of data for an image representation showing the spatial distribution of the magnetic resonance behavior of an object within a selected localized region comprising the steps of:

arranging the object in a stationary magnetic field;

exposing the object to a succession of high frequency pulses and pulses of magnetic field gradients in different spatial directions in such manner that a succession of magnetic resonance signals appears wherein said succession of high frequency pulses and pulses of magnetic field gradients comprises at least two different sequences of high frequency pulses and magnetic field gradient pulses which differ in at least one of the features of the signal production responsible for different aspects of the image quality and wherein these sequences are carried out after one another in time;

reading said magnetic resonance signals by scanning under the influence of respective read gradients and using said signals as data sets for the filling a K-space, and, entering the magnetic resonance signals read out for different sequences into different bands of the K-space.

2. Method according to claim 1, wherein the step of exposing the object to a succession of high frequency pulses and pulses of magnetic field gradients comprises the steps of selecting, a sequence of high frequency pulses and magnetic field gradient pulses which emphasizes a desired aspect of image quality and wherein the signals scanned therefrom are collated in the middle band of the K-space, and, in order to fill the remaining part of the K-space, using one or more other sequences which lay less emphasis on the particular aspect.

3. Method according to claim 1, wherein the step of exposing the object to a succession of high frequency pulses and pulses of magnetic field gradients comprises the steps of selecting, a sequence of high frequency pulses and magnetic field gradient pulses which emphasizes a desired aspect of image quality and wherein the signals scanned therefrom are collated in the central band of the K-space, and, in order to fill the remaining part of the K-space, using one or more more rapid sequences, even if emphasizing the particular aspect less.

4. Method according to claim 1, wherein the step of entering the magnetic resonance signals into different bands of the K-space comprises the step of filling the middle band of the K-space with the scan values of gradient echoes which are produced by a train of high frequency excitation pulses with flip angles of less than 90° and a repetition time <<T1.

5. Method according to claim 4, comprising the additional step of subsequently filling the remaining part of the K-space with scanned values of magnetic resonance signals which are produced by refocusing of the previously produced gradient echoes by means of a refocusing high frequency pulse.

6. Method according to claim 4, comprising the additional step of subsequently filling the remaining part of the K-space with scanned values of magnetic resonance signals which are produced by a following series of refocusing high frequency pulses.

7. Method according to claim 1 wherein the step of exposing the object to a succession of high frequency pulses and pulses of magnetic field gradients comprises the steps of filling the middle band of the K-space with scanned values of spin echo signals which are produced by an excitation pulse and a following series of refocusing high frequency pulses.

8. Method according to claim 4, comprising the additional step of subsequently filling the remaining part of the K-space with scanned values from gradient echoes which are produced by multiple polarity reversal of the read gradient after a high frequency excitation pulse.

9. Method according to claim 1 wherein the step of exposing the object to a succession of high frequency pulses and pulses of magnetic field gradients comprises the steps of filling the middle band of the K-space with the scanned values from gradient echoes which are produced by multiple polarity reversal of the read gradient after a high frequency excitation pulse.

10. Method according to claim 9, comprising the additional step of subsequently filling the remaining part of the K-space with scanned values from signals which are produced by a following train of refocusing high frequency pulses.

11. Method according to claim 7, comprising the additional step of subsequently filling the remaining part of the K-space with scanned values from gradient echoes which are produced respectively after high frequency excitation pulses.

12. Method according to claim 4, comprising the additional step of subsequently filling the remaining part of the K-space with scanned values from echoes which are produced by a series of exciting or refocusing high frequency pulses, between which echo signals are produced by multiple polarity reversal of the read gradient.

13. Method according to claim 1, wherein the K-space to be filled is two-dimensional or multidimensional.

14. Method according to claim 1, wherein the step of entering the magnetic resonance signals into different bands of the K-space comprises the step of following trajectories which correspond to other paths than the course of the lines of the K-space.

15. Method according to claim 1, wherein different sequences with different bandwidths of the echo scanning are read out.

16. Method according to claim 1, comprising the additional step of obtaining a preliminary magnetic resonance sequence before exposing the object to a succession of high frequency pulses and pulses of magnetic field gradients in different spatial directions.

17. Method according to claim 16, wherein said preliminary magnetic resonance sequence comprises a suitable combination of high frequency pulses and magnetic field gradient pulses to produce an image contrast on the basis of T1, T1$e$, T2, T2*, flow or diffusion or in order to produce a magnetisation transfer contrast (MTC) or in order to suppress fat or water.

18. Apparatus for the acquisition of data for an image representation which shows the spatial distribution of magnetic resonance behavior of an object within a selected localised region, comprising means (11, 21) for producing a homogeneous magnetic field in the object region to be investigated, which directs the spin in the field direction, means (15, 23) for producing high frequency pulses which act on the object region, means (12, 13, 14, 22) for producing magnetic field gradients in different spatial directions, means (40, 50) for reading out the magnetic resonance echo signals arising from the object region in respnse to the high frequency pulses and magnetic field gradients and writing these echo signals into the K-space, and a control means (30) for controlling the means producing the high frequency pulses and the means producing the magnetic field gradients and the readout means such that the object region is subjected to a succession of at least two different sequences of high frequency pulses and magnetic field gradient pulses in order to produce different sequences of magnetic resonance echo signals which differ in at least one of the features of the echo production which are responsible for different aspects of image quality, and that the echo signals of the different sequences are written into respective different bands of the K-space.

* * * * *